US011335570B2

(12) United States Patent
Koduri

(10) Patent No.: US 11,335,570 B2
(45) Date of Patent: *May 17, 2022

(54) MULTIROW GULL-WING PACKAGE FOR MICROELECTRONIC DEVICES

(71) Applicant: Texas Instruments Incorporated, Dallas, TX (US)

(72) Inventor: Sreenivasan K Koduri, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 333 days.

This patent is subject to a terminal disclaimer.

(21) Appl. No.: 16/225,182

(22) Filed: Dec. 19, 2018

(65) Prior Publication Data

US 2020/0203184 A1 Jun. 25, 2020

(51) Int. Cl.
*H01L 23/498* (2006.01)
*H01L 23/495* (2006.01)
(Continued)

(52) U.S. Cl.
CPC ...... *H01L 21/4853* (2013.01); *H01L 21/4803* (2013.01); *H01L 21/561* (2013.01); *H01L 21/568* (2013.01); *H01L 23/3121* (2013.01); *H01L 23/49537* (2013.01); *H01L 23/49541* (2013.01); *H01L 23/49555* (2013.01); *H01L 23/49811* (2013.01); *H01L 24/48* (2013.01); *H01L 24/85* (2013.01); *H01L 24/95* (2013.01);
(Continued)

(58) Field of Classification Search
CPC ... H01L 2224/05017; H01L 23/49541–49555; H01L 23/49575; H01L 23/49582; H01L 23/3107; H01L 2224/85385; H01L 2224/48106; H01L 2224/85005; H01L 24/85; H01L 24/48; H01L 23/49537
See application file for complete search history.

(56) References Cited

U.S. PATENT DOCUMENTS 7,704,800 B2 4/2010 Zhang
8,487,424 B2 7/2013 Lam
(Continued)

*Primary Examiner* — Michael M Trinh
(74) *Attorney, Agent, or Firm* — Dawn Jos; Charles A. Brill; Frank D. Cimino

(57) ABSTRACT

A microelectronic device, in a multirow gull-wing chip scale package, has a die connected to intermediate pads by wire bonds. The intermediate pads are free of photolithographically-defined structures. An encapsulation material at least partially surrounds the die and the wire bonds, and contacts the intermediate pads. Inner gull-wing leads and outer gull-wing leads, located outside of the encapsulation material, are attached to the intermediate pads. The gull-wing leads have external attachment surfaces opposite from the intermediate pads. The external attachment surfaces of the outer gull-wing leads are located outside of the external attachment surfaces of the inner gull-wing leads. The microelectronic device is formed by mounting the die on a carrier, forming the intermediate pads without using a photolithographic process, and forming the wire bonds. The encapsulation material is formed, and the carrier is subsequently removed, exposing the intermediate pads. The gull-wing leads are formed on the intermediate pads.

15 Claims, 30 Drawing Sheets

(51) Int. Cl.
  *H01L 21/48* (2006.01)
  *H01L 23/31* (2006.01)
  *H01L 21/56* (2006.01)
  *H01L 23/00* (2006.01)

(52) U.S. Cl.
  CPC ............... *H01L 2224/48159* (2013.01); *H01L 2224/85005* (2013.01); *H01L 2224/85385* (2013.01)

(56) References Cited

U.S. PATENT DOCUMENTS

| | | | |
|---|---|---|---|
| 2003/0132533 A1* | 7/2003 | Kawahara | H01L 21/4832 257/787 |
| 2007/0046313 A1* | 3/2007 | Eldridge | B23K 1/0008 324/750.03 |
| 2009/0042339 A1 | 2/2009 | Embong et al. | |
| 2011/0309493 A1 | 12/2011 | Goh et al. | |
| 2015/0270208 A1* | 9/2015 | Otremba | H01L 25/072 257/139 |
| 2020/0203242 A1* | 6/2020 | Koduri | H01L 25/50 |
| 2020/0203243 A1* | 6/2020 | Koduri | H01L 24/32 |
| 2020/0203263 A1* | 6/2020 | Koduri | H01L 21/568 |

* cited by examiner

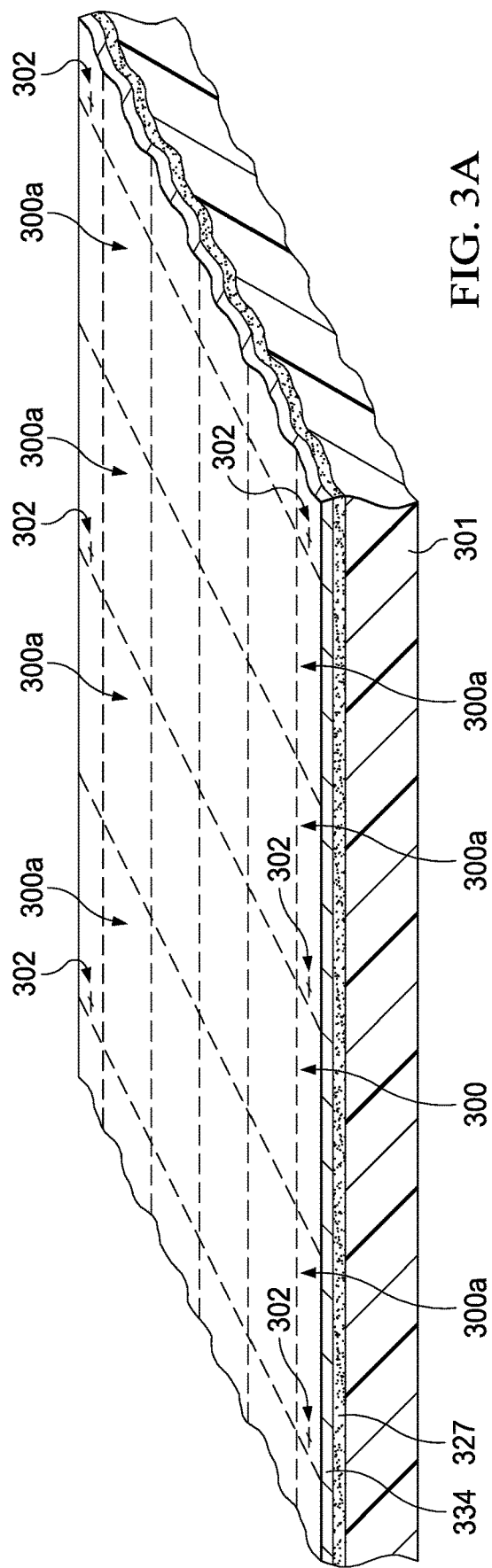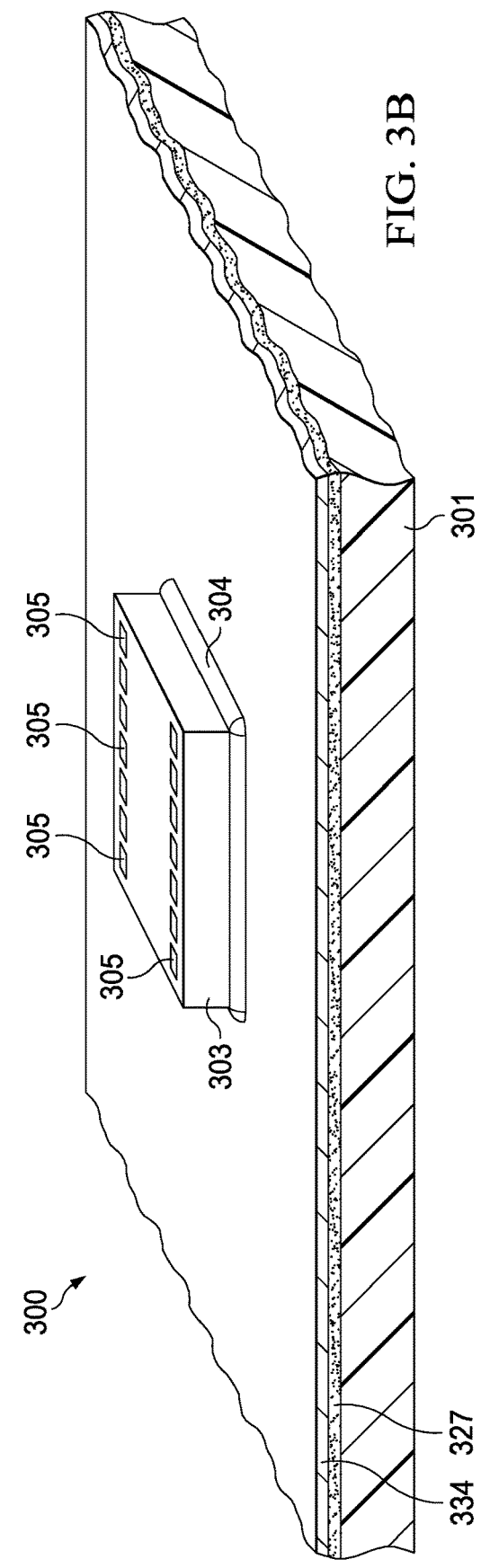

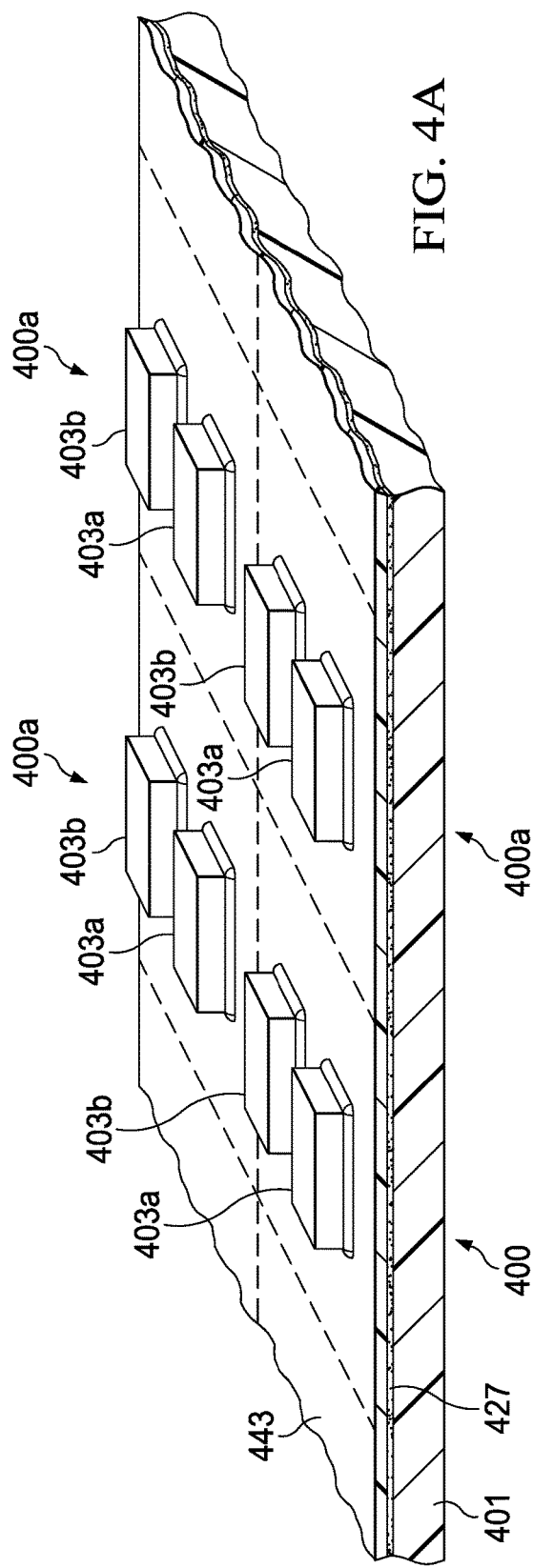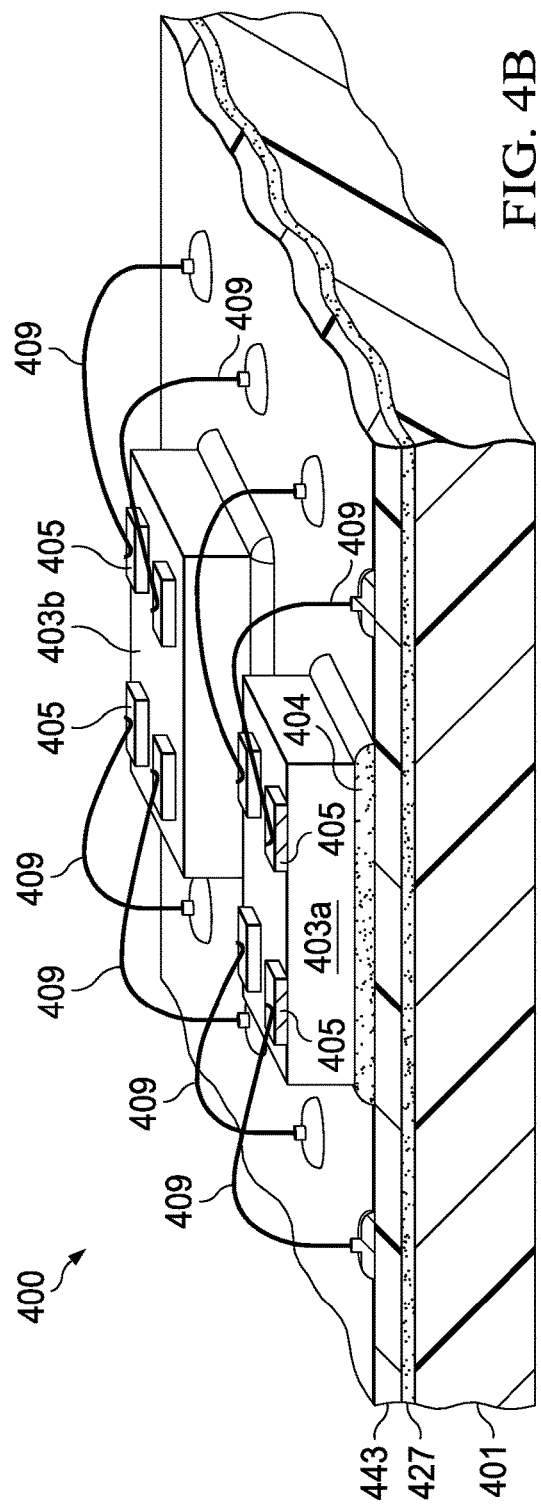

MULTIROW GULL-WING PACKAGE FOR MICROELECTRONIC DEVICES

FIELD

This disclosure relates to the field of microelectronic devices. More particularly, this disclosure relates to chip scale packaging of microelectronic devices.

BACKGROUND

Gull wing packages provide reliable connections to circuit boards for microelectronic devices. Gull wing packages are particularly appropriate for harsh environments such as automotive and industrial applications. A gull wing package commonly has a single row of leads on each side of the package, limiting the number of connections for a given package size. Conventional methods of making gull wing packages are not compatible with more than one row of leads on each side of the package. Moreover, the lead frames used in gull wing packages must meet several criteria to provide desired reliability. The lead frame must provide a suitable surface for wire bonding to the microelectronic device, and must have a shape and surface material suitable for adhering to the encapsulation material of the package. Meeting the criteria imposes undesirable costs on the lead frame.

SUMMARY

The present disclosure introduces a microelectronic device having a multirow gull-wing chip scale package, and a method for forming the microelectronic device. The microelectronic device includes a die, intermediate pads located adjacent to the die, and wire bonds connecting the die to the intermediate pads. The intermediate pads are free of photolithographically-defined structures. An encapsulation material at least partially surrounds the die and the wire bonds, and extends to the intermediate pads. Inner gull-wing leads and outer gull-wing leads contacting the intermediate pads are located outside of the encapsulation material. The inner gull-wing leads and the outer gull-wing leads have external attachment surfaces at opposite ends of the inner gull-wing leads and the outer gull-wing leads from the intermediate pads. The external attachment surfaces of the outer gull-wing leads are located outside of the external attachment surfaces of the inner gull-wing leads.

The microelectronic device is formed by mounting the die on a carrier, and forming the intermediate pads adjacent to the die without using a photolithographic process. Wire bonds are formed between the die and the intermediate pads. The die, the wire bonds, and the intermediate pads are covered with an encapsulation material, and the carrier is subsequently removed, exposing the intermediate pads. The inner gull-wing leads and the outer gull-wing leads are attached to the intermediate pads.

BRIEF DESCRIPTION OF THE VIEWS OF THE DRAWINGS

FIG. 3A through FIG. 3K include various views of a microelectronic device having a multirow gull-wing chip scale package, depicted in stages of a further example method of formation.

FIG. 4A through FIG. 4I include various views of a microelectronic device having a multirow gull-wing chip scale package, depicted in stages of a further example method of formation.

DETAILED DESCRIPTION

Figure 1A:
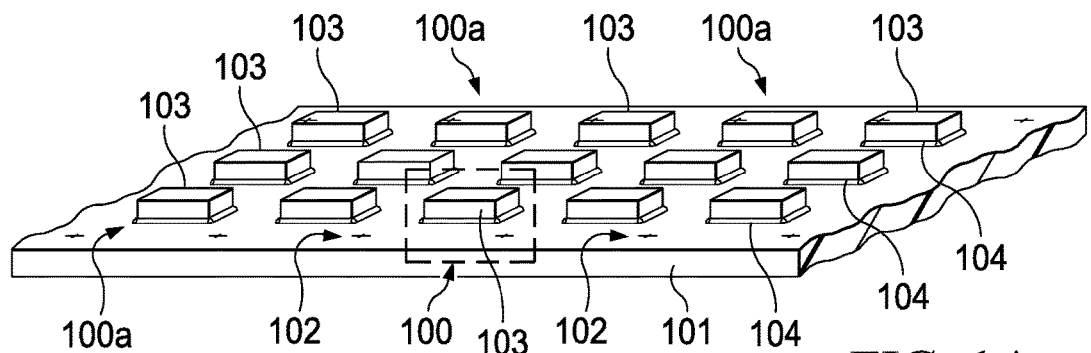
FIG. 1A through FIG. 1K include perspectives, cross sections, and a top view of a microelectronic device having a multirow gull-wing chip scale package, depicted in stages of an example method of formation.

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

In addition, although some of the embodiments illustrated herein are shown in two dimensional views with various regions having depth and width, it should be clearly understood that these regions are illustrations of only a portion of a device that is actually a three dimensional structure. Accordingly, these regions will have three dimensions, including length, width, and depth, when fabricated on an actual device. Moreover, while the present invention is illustrated by embodiments directed to active devices, it is not intended that these illustrations be a limitation on the scope or applicability of the present invention. It is not intended that the active devices of the present invention be limited to the physical structures illustrated. These structures are included to demonstrate the utility and application of the present invention to presently preferred embodiments.

This application is related to the following U.S. patent applications: U.S. patent application Ser. No. 16/225,106, filed concurrently with this application, U.S. patent application Ser. No. 16/225,135, filed concurrently with this application, and U.S. patent application Ser. No. 16/225,164, filed concurrently with this application. For applications filed concurrently with this application, with their mention in this section, these patent applications are not admitted to be prior art with respect to the present invention.

A microelectronic device has a die in a multirow gull-wing chip scale package. The multirow gull-wing chip scale package includes intermediate pads located adjacent to the die. The intermediate pads are free of photolithographically-defined structures. Wire bonds connect the die to the intermediate pads. An encapsulation material at least partially surrounds the die and the wire bonds, and extends to the intermediate pads. The intermediate pads are located at a surface of the encapsulation material. The microelectronic device includes inner gull-wing leads and outer gull-wing leads, located outside of the encapsulation material. The inner gull-wing leads and the outer gull-wing leads contact the intermediate pads. Each of the inner gull-wing leads and each of the outer gull-wing leads has an external attachment surface located opposite from the corresponding intermediate pad. For the purposes of this disclosure, a multirow gull-wing chip scale package has multiple rows of gull-wing leads, and wire bonds to the intermediate pads that are formed after the die is singulated from a wafer which contained the die.

Each of the inner gull-wing leads has a first portion which contacts the corresponding intermediate pad, a second portion continuous with the first portion and extending away from the intermediate pad, and a third portion continuous with the second portion, opposite from the first portion. The third portion includes the external attachment surface. The first portion extends laterally in a first direction from a boundary with the second portion. In this case, the term "laterally" refers to a direction parallel to a surface of the encapsulation material containing the intermediate pads. The third portion extends laterally in a second direction, opposite from the first direction, from a boundary with the second portion. The third portion is not coplanar with the first portion, being offset by the second portion.

Similarly, each of the outer gull-wing leads has a first portion which contacts the corresponding intermediate pad, a second portion continuous with the first portion and extending away from the intermediate pad, and a third portion continuous with the second portion, opposite from the first portion. The first portion, the second portion, and the third portion of each of the outer gull-wing leads has the same spatial relationships with respect to the surface of the encapsulation material containing the intermediate pads and to each other as the first portion, the second portion, and the third portion of each of the inner gull-wing leads.

The external attachment surfaces of the outer gull-wing leads are located outside of the external attachment surfaces of the inner gull-wing leads, that is, the external attachment surface of each outer gull-wing lead is located farther from a center of the die than the external attachment surface of an inner gull-wing lead located adjacent to the outer gull-wing lead.

The microelectronic device is formed by mounting the die on a carrier, and forming the intermediate pads adjacent to the die without using a photolithographic process. Wire bonds are formed between the die and the intermediate pads. The die, the wire bonds, and the intermediate pads are covered with an encapsulation material. The encapsulation material extends to the intermediate pads. The carrier is subsequently removed, exposing the intermediate pads. The inner gull-wing leads and the outer gull-wing leads are attached to the intermediate pads.

For the purposes of this disclosure, photolithographically-defined structures include structures which are formed by forming a layer, using a photolithographic process to form an etch mask over the layer, and removing the layer where exposed by the etch mask. Photolithographically-defined structures include structures which are formed by using a photolithographic process to form a plating mask, and plating metal in areas exposed by the plating mask. For the purposes of this disclosure, photolithographic processes include exposing photosensitive material to patterned radiation using a photomask, exposing photosensitive material to patterned radiation using a maskless light source such as a micro-mirror system, X-ray lithography, e-beam lithography, and exposing photosensitive material to patterned radiation using scanned laser lithography.

For the purposes of this disclosure, the term "wire bonding" is understood to encompass bonding with round bond wire and with ribbon wire. Furthermore, the term "wire bonding" is understood to encompass ball bonding, stitch bonding, and wedge bonding. Similarly, the term "wire bond" is understood to encompass bonds with round bond wire and ribbon wire, and encompass bonds with ball bonds, stitch bonds, and wedge bonds. The term "die" is used in this disclosure to denote a single chip or more than one chip.

It is noted that terms such as top, bottom, front, back, over, above, under, and below may be used in this disclosure. These terms should not be construed as limiting the position or orientation of a structure or element, but should be used to provide spatial relationship between structures or elements.

The terms "parallel" and "perpendicular" are used to describe spatial relationships of elements with respect to other elements. In one aspect of this disclosure, the terms "parallel" and "perpendicular" encompass spatial relationships that are parallel or perpendicular within fabrication tolerances encountered in the fabrication of the respective elements. In another aspect, the terms "parallel" and "perpendicular" encompass spatial relationships that are parallel or perpendicular within measurement tolerances encountered when measuring the spatial relationships.

FIG. 1A through FIG. 1K include perspectives, cross sections, and a top view of a microelectronic device having a multirow gull-wing chip scale package, depicted in stages of an example method of formation. Referring to FIG. 1A, formation of the microelectronic device 100 begins by providing a carrier 101. The carrier 101 includes one or more materials suitable as a substrate for forming wire bond studs, and further suitable for separation from an encapsulation material, such as epoxy. In this example, the carrier 101 may be flexible, to facilitate separation from the encapsulation material. The carrier 101 may include, for example, polycarbonate, phenolic, or acrylic material. The carrier 101 may also include particles of a hard inorganic material, such as aluminum oxide or diamond, to provide increased hardness. The carrier 101 may have a laminated structure, with a thin, hard surface layer of glass or metal, attached to a flexible substrate. Other compositions and structures for the carrier 101 are within the scope of this example. The carrier 101 may have alignment marks 102 to assist subsequent placement of die on the carrier 101. The carrier 101 may have a continuous, belt-like configuration, or may have a flat rectangular configuration.

Multiple die 103 are attached to the carrier 101, in this example. One of the die 103 is attached to the carrier 101 in an area for the microelectronic device 100, and additional die 103 are attached to the carrier 101 in separate areas for additional microelectronic devices 100a. The die 103 may be manifested as integrated circuits, discrete semiconductor components, electro-optical devices, microelectrical mechanical systems (MEMS) devices, or other microelectronic die. The die 103 may all be substantially similar devices, for example, may all be instances of a particular power transistor. Alternatively, the die 103 may include more than one device type.

The die 103 may be attached to the carrier 101 by a die attach material 104, such as an adhesive. The die attach material 104 may be electrically non-conductive, to electrically isolate the die 103. The die attach material 104 may include, for example, epoxy. The die attach material 104 may include particles such as copper or silver, coated with an insulating layer, to increase thermal conductivity from the die 103 to an exterior of the microelectronic device 100.

Figure 1B:
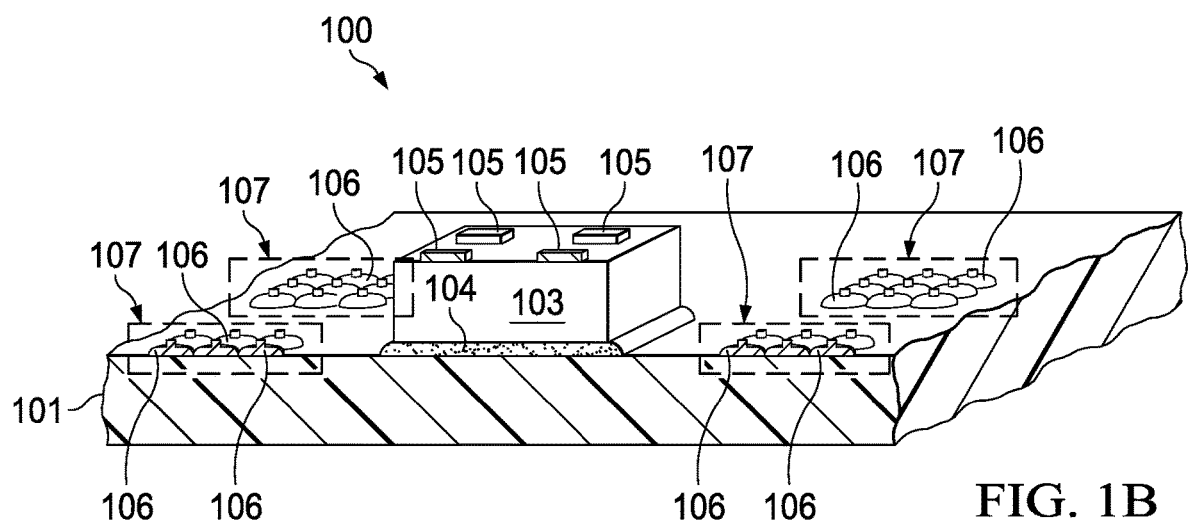

FIG. 1B shows the microelectronic device 100 in more detail. The die 103 may have terminals 105 for electrical connections to components in the die 103. The terminals 105 may be manifested as bond pads, or may be manifested as circuit nodes, such as transistor source and drain nodes. The terminals 105 may include materials suitable for wire bonding, such as aluminum, copper, gold, or platinum.

Wire bond studs 106 are formed on the carrier 101 adjacent to the die 103, using a wire bonding process. The wire bond studs 106 may be formed by pressing a free air ball of a bond wire onto the carrier 101 with a wire bonding capillary to form a stud, and subsequently severing the bond wire proximate to the stud. The wire bond studs 106 may include primarily copper or gold, and may have some nickel or palladium from a barrier layer around the bond wire. The wire bond studs 106 are formed in groups to form initial portions of intermediate pads 107. The wire bond studs 106 in each intermediate pad 107 may optionally be connected to other wire bond studs 106 in the same intermediate pad 107 by one or more intra-pad wire bonds, as disclosed in the commonly assigned patent application having patent application Ser. No. 16/225,106 (filed concurrently with this application, which is incorporated herein by reference but is not admitted to be prior art with respect to the present invention by its mention in this section.

Figure 1C:
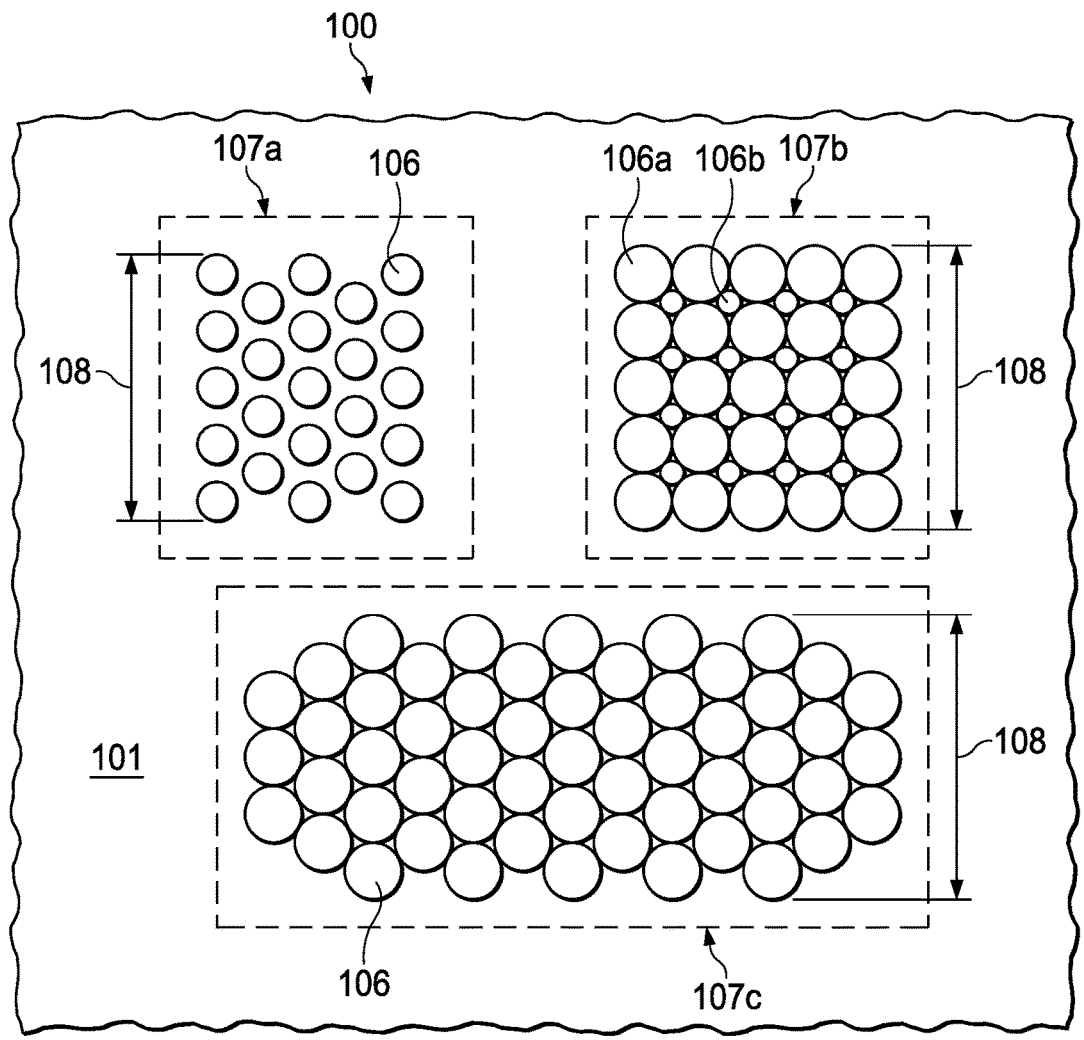

FIG. 1C depicts example configurations of the wire bond studs 106 in the intermediate pads 107 of FIG. 1B. A first intermediate pad 107a may be implemented as a hexagonal array, with wire bond studs 106 of substantially equal sizes, as a result of being formed with equal diameter bond wire and equal force on the wire bonding capillary. Adjacent wire bond studs 106 may be separated from each other in the first intermediate pad 107a, by a lateral space that is sufficiently narrow, so that subsequently-plated metal on the adjacent wire bond studs 106 in the first intermediate pad 107a merges together to form a metal pad that is continuous across all the wire bond studs 106 in the first intermediate pad 107a. For example, the adjacent wire bond studs 106 may be separated by a space that is 1 to 5 times a thickness of the subsequently-plated metal. The first intermediate pad 107a may have a minimum lateral dimension 108 of 150 microns to 300 microns. The term "lateral" in this case refers to a direction parallel to a face of the carrier 101 on which the wire bond studs 106 are formed. The minimum lateral dimension 108 may be selected to maintain current density through the first intermediate pad 107a, during operation of the microelectronic device 100, below a target value, to provide a desired level of reliability. The minimum lateral dimension 108 may also be selected to provide desired level of mechanical integrity for subsequently attaching leads, shown in FIG. 1K.

A second intermediate pad 107b may have a square array configuration, with first wire bond studs 106a of substantially equal first sizes, and second wire bond studs 106b of substantially equal second sizes, smaller than the first size. The second wire bond studs 106b may be disposed between the first wire bond studs 106a to provide a higher fill factor of electrically conductive material in the second intermediate pad 107b. Adjacent first wire bond studs 106a and second wire bond studs 106b contact each other in the second intermediate pad 107b, to form a contiguous electrically conductive array on the carrier 101. The second intermediate pad 107b may have a minimum lateral dimension 108 of 150 microns to 300 microns, to provide desired levels of reliability and mechanical integrity as explained in reference to the first intermediate pad 107a.

A third intermediate pad 107c may have an elongated configuration, with wire bond studs 106 of substantially equal sizes arranged in a hexagonal array. Adjacent wire bond studs 106 may contact each other, to provide a lower resistance in the third intermediate pad 107c. The third intermediate pad 107c may have a minimum lateral dimension 108 of 150 microns to 300 microns, and may have a length significantly longer than the minimum lateral dimension 108, to provide desired level of reliability as explained in reference to the first intermediate pad 107a. The elongated configuration of the third intermediate pad 107c may be appropriate for power and ground connections to the microelectronic device 100, which commonly conduct significantly more current than signal connections.

Figure 1D:
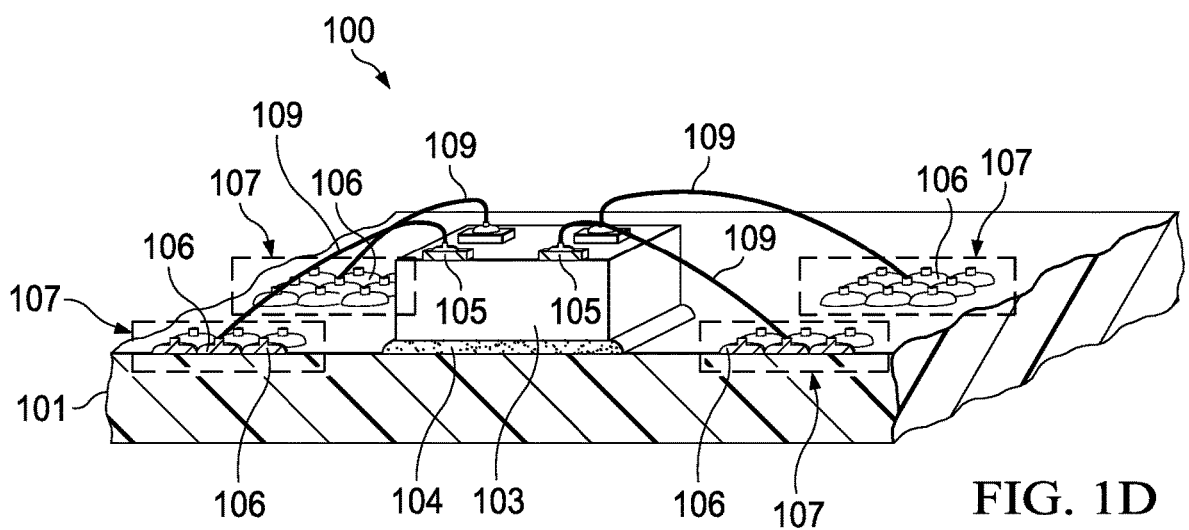

Referring to FIG. 1D, wire bonds 109 are formed by a wire bonding process to connect the die 103 to the intermediate pads 107. FIG. 1D depicts the wire bonds 109 as formed using round bond wire. Other types of bond wire, such as ribbon bond wire, are within the scope of this example. The wire bonds 109 may include, for example, copper wire, gold wire, or aluminum wire. Copper wire in the wire bonds 109 may optionally have a coating of palladium or nickel to reduce corrosion or oxidation of the copper wire. The wire bonds 109 may be formed with ball bonds on the die 103 and stitch bonds on the intermediate pads 107, as depicted in FIG. 1F. Alternatively, the wire bonds 109 may be formed with stitch bonds on the die 103 and ball bonds on the intermediate pads 107.

The wire bonds 109 may connect to the terminals 105 on the die 103, as depicted in FIG. 1D. The wire bonds 109 may connect each of the terminals 105 to a separate intermediate pad 107, as indicated in FIG. 1D. Alternatively, one of the intermediate pads 107 may be connected by the wire bonds 109 to two or more of the terminals 105. Similarly, one of the terminals 105 may be connected by the wire bonds 109 to two or more of the intermediate pads 107.

Figure 1E:
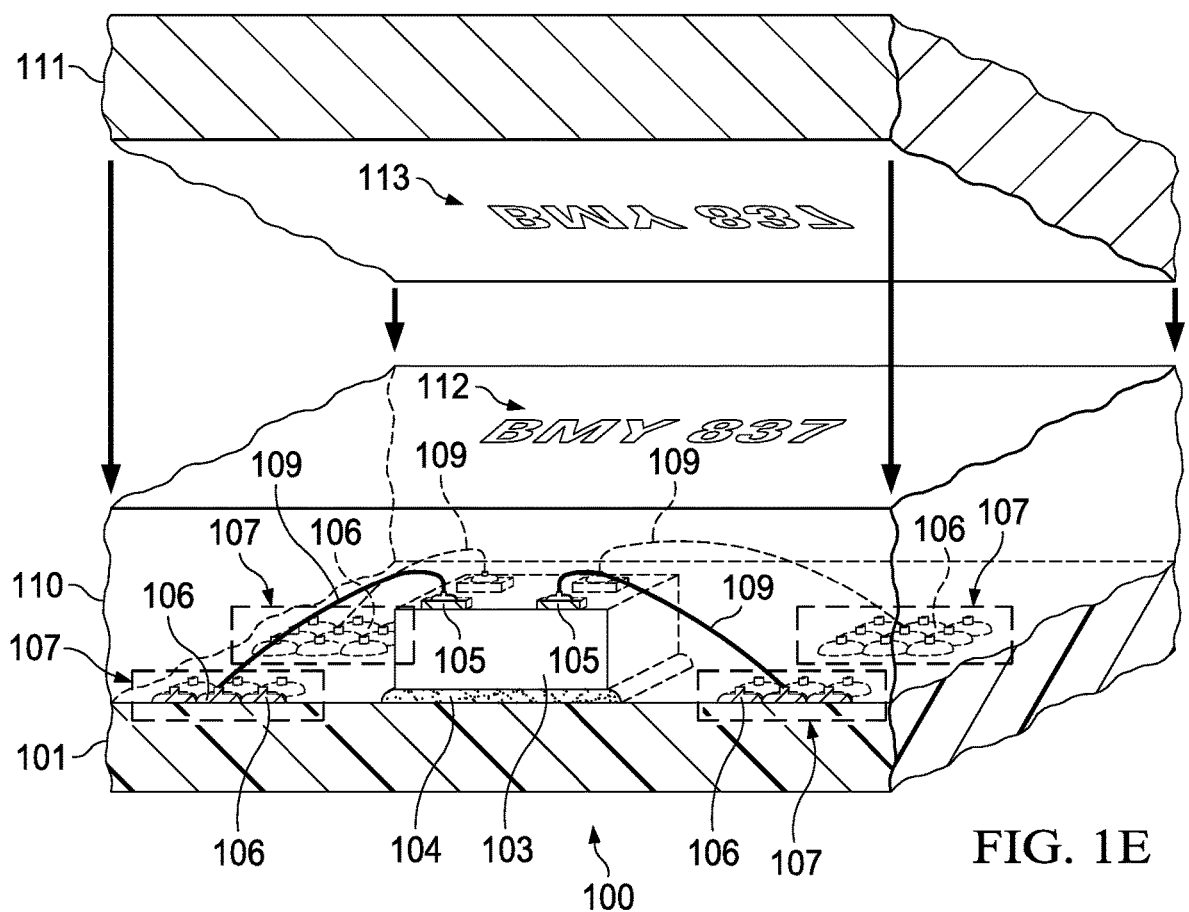
Figure 1F:
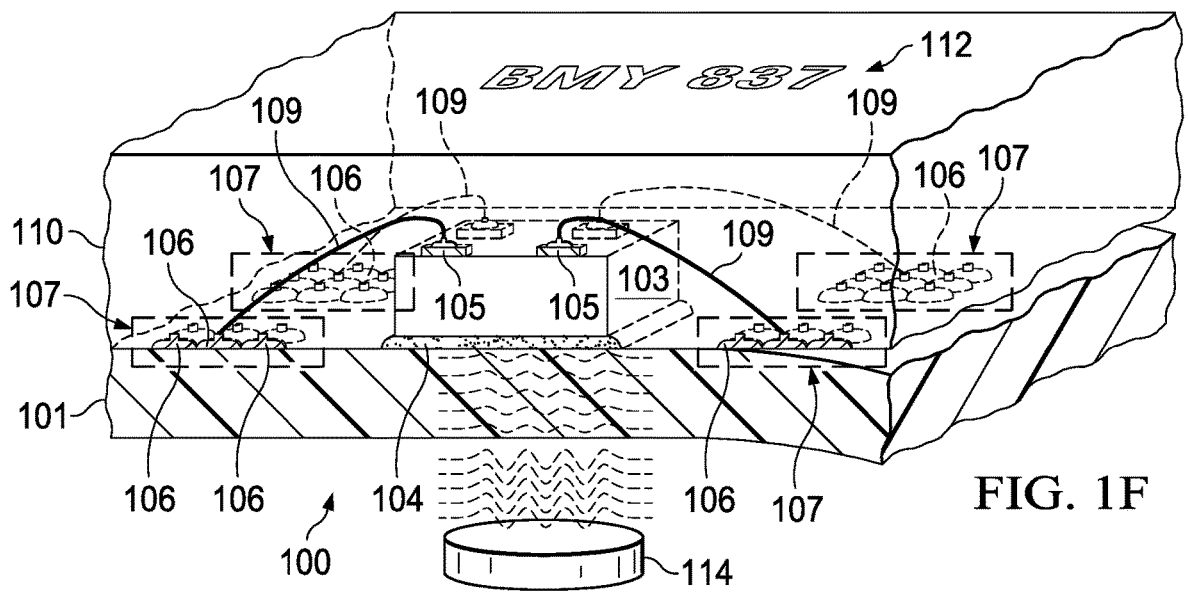

Referring to FIG. 1E, an encapsulation material 110 is formed over the die 103, the wire bonds 109, and the intermediate pads 107. The encapsulation material 110 contacts the intermediate pads 107. The encapsulation material 110 may include epoxy or other material suitable for protecting the die 103 and the wire bonds 109 from moisture and contamination. The encapsulation material 110 does not need to adhere to a lead frame, and so may optionally be free of adhesion promoters and other additives which are used to provide reliable adhesion to leads frames of chip carriers. The encapsulation material 110 may thus be less expensive, advantageously reducing a material cost of the microelectronic device 100. The encapsulation material 110 may be formed by using a press mold 111; the press mold 111 is removed after the encapsulation material 110 is formed. Alternatively, the encapsulation material 110 may be formed by injection molding, by an additive process, or by other methods. The encapsulation material 110 extends to the carrier 101 adjacent to the die 103 and adjacent to the intermediate pads 107.

A device identification mark 112 may be formed on the encapsulation material 110 by a raised symbolization feature 113 on the press mold 111. Alternatively, the device identification mark 112 may be formed at a subsequent step of the formation process.

Referring to FIG. 1F, the carrier 101 is removed from the microelectronic device 100 by separating the carrier 101 from the encapsulation material 110 and from the wire bond studs 106. Removal of the carrier 101 may be facilitated using ultrasonic vibrations applied by an ultrasonic transducer 114, as indicated in FIG. 1F. Other methods for removing the carrier 101, such as using a thermal shock, using penetrating solvents, or mechanical cleaving, are within the scope of this example. Removal of the carrier 101 exposes the wire bond studs 106 of the intermediate pads 107.

Figure 1G:
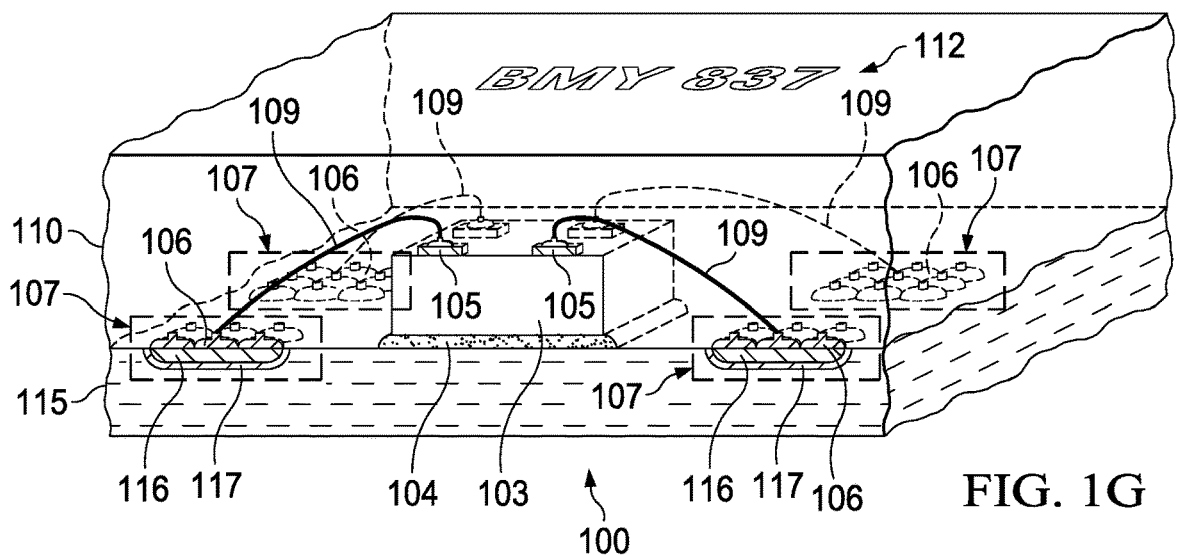

Referring to FIG. 1G, a plating process using at least one plating bath 115 forms one or more plated metal layers of the intermediate pads 107 on the wire bond studs 106 where exposed by the encapsulation material 110. The one or more plated metal layers may include a base layer 116 on the wire bond studs 106, and a barrier layer 117 on the base layer 116. The chemistry of the plating bath 115 may be changed to provide desired compositions of the one or more plated metal layers. The plating process may be implemented as an autocatalytic electroless process or an immersion process, for example. An autocatalytic electroless process may be continued as long as needed to provide a desired thickness of the metal layer. An immersion process is substantially self-limiting, producing a metal layer that is a few nanometers thick. The base layer 116 may include a metal with a high electrical conductivity, such as copper, and may be formed to be 50 microns to 150 microns thick, to interconnect the wire bond studs 106 in each intermediate pad 107 through low resistance connections. The barrier layer 117 may include one or more metals that reduce diffusion between metal in the base layer 116 and subsequently formed leads, shown in FIG. 1K, on the intermediate pads 107. The barrier layer 117 may include, for example, nickel, palladium, cobalt, titanium, or molybdenum. The barrier layer 117 may be formed to be 5 microns to 20 microns thick, for example. The base layer 116 and the barrier layer 117 may be characterized by a conformal configuration on the wire bond studs 106, in which the base layer 116 and the barrier layer 117 conform to contours of the wire bond studs 106, resulting from the plating process. The base layer 116 and the barrier layer 117 are parts of the intermediate pads 107, along with the wire bond studs 106, in this example. Forming the base layer 116 and the barrier layer 117 without using a photolithographic process, and thus forming the intermediate pads 107 without using a photolithographic process, may further reduce the fabrication cost and the fabrication complexity of the microelectronic device 100.

Figure 1H:
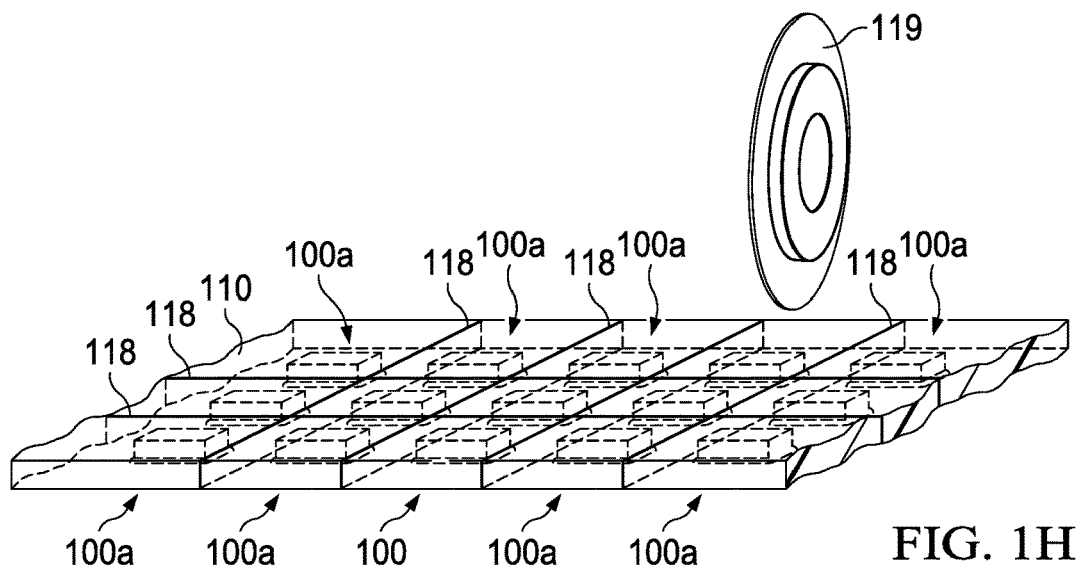

Referring to FIG. 1H, the microelectronic device 100 is singulated from the additional microelectronic devices 100a by cutting through the encapsulation material 110 in singulation lanes 118 between the microelectronic device 100 and the additional microelectronic devices 100a. The microelectronic device 100 may be singulated by a saw process using a saw blade 119, as indicated in FIG. 1H. Singulating the microelectronic device 100 may be facilitated by the absence of metal in the singulation lanes 118. Other methods of singulating the microelectronic device 100, such as using a laser ablation process or using a water jet process, are within the scope of this example.

Figure 1I:
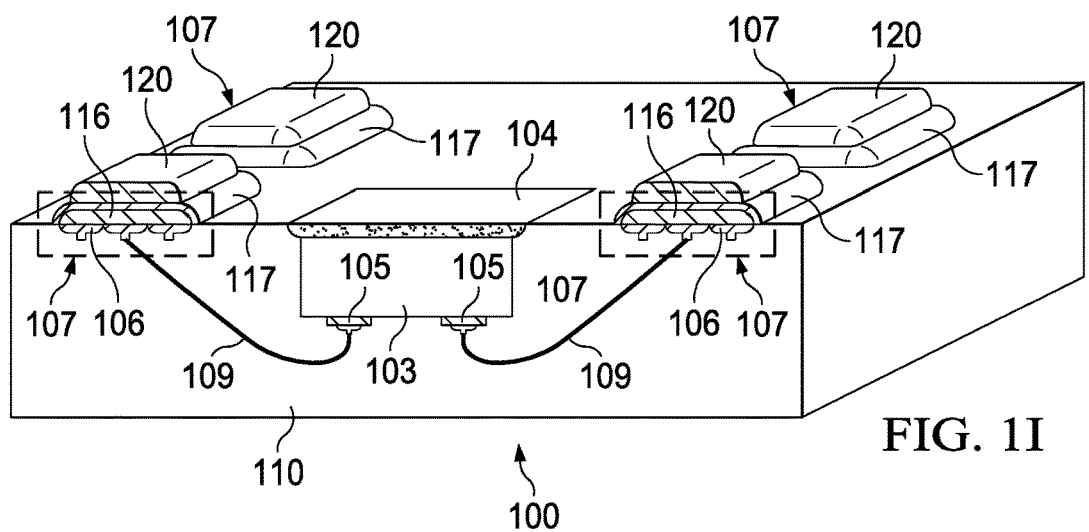

Referring to FIG. 1I, a solder 120 is formed on the barrier layer 117 of the intermediate pads 107. The solder 120 may include, for example, tin, silver, and copper. Other compositions of the solder 120 are within the scope of this example. The solder 120 may be formed, in one version of this example, by disposing solder paste on the barrier layer 117, followed by a solder reflow operation to remove volatile material from the solder paste. In another version, the solder 120 may be formed by disposing melted solder onto the barrier layer 117, using a solder fountain or a solder bath. In a further version, the solder 120 may be formed by disposing preformed solder balls or tabs onto the barrier layer 117, followed by a solder reflow operation to adhere the solder 120 to the barrier layer 117. Other methods for forming the solder 120 on the barrier layer 117 are within the scope of this example.

Figure 1J:
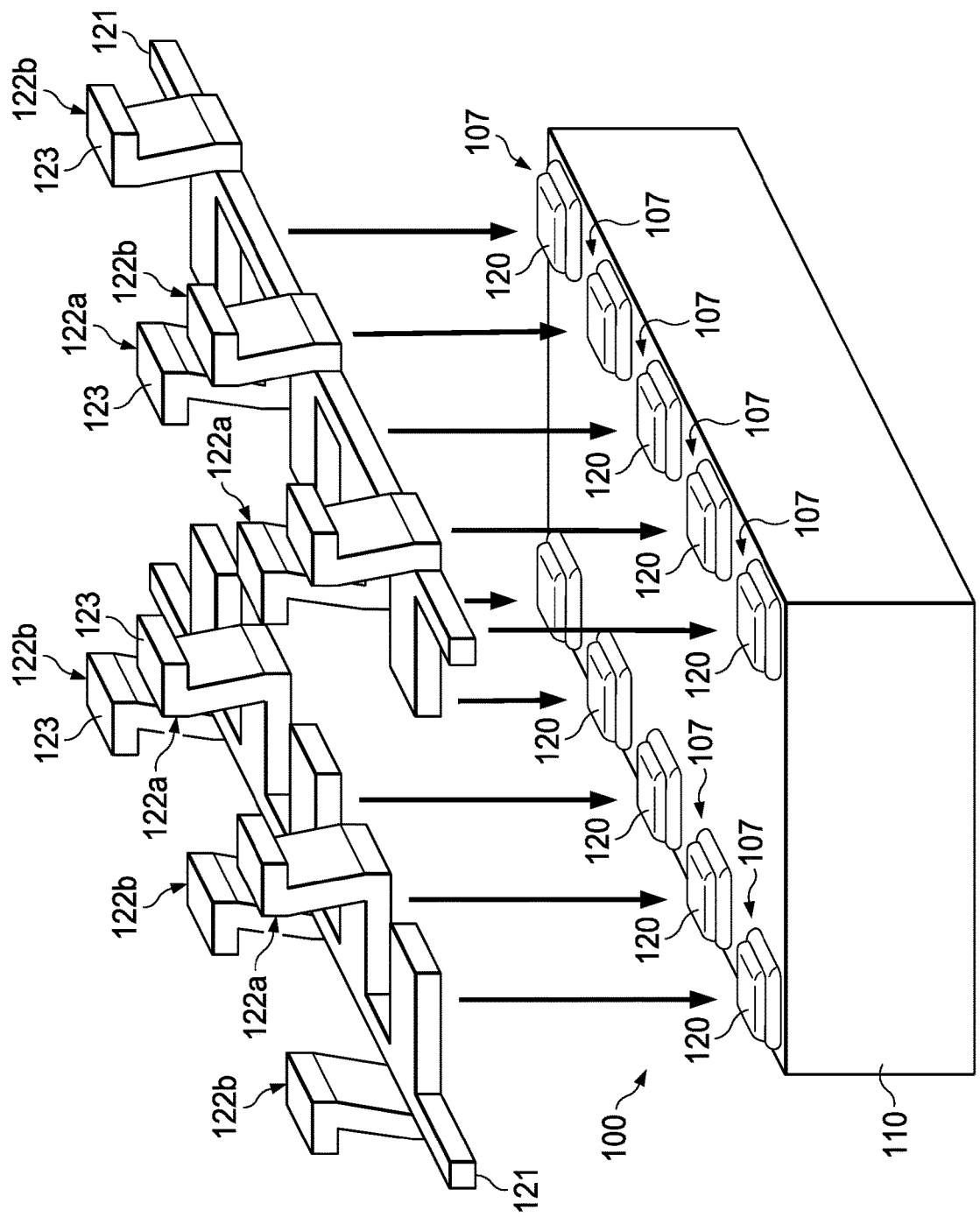

Referring to FIG. 1J, a lead frame 121 is provided with inner gull-wing leads 122a and outer gull-wing leads 122b. In this example, both the inner gull-wing leads 122a and the outer gull-wing leads 122b may be formed into gull-wing shapes before the inner gull-wing leads 122a and the outer gull-wing leads 122b are attached to the intermediate pads 107. Each of the with inner gull-wing leads 122a and the outer gull-wing leads 122b has an external attachment surface 123.

The inner gull-wing leads 122a and the outer gull-wing leads 122b are not constrained by requirements for wire bonding, such as tight spacing or wire bondable surfaces, and so may have relaxed dimensions and less expensive surface materials compared to leads used for wire bonding. The lead frame 121 may include, for example, stainless steel, or copper clad with stainless steel, to provide a desired balance between mechanical strength and electrical resistance. The inner gull-wing leads 122a and the outer gull-wing leads 122b do not require surface features to provide adhesion to mold compounds, such as roughened surface areas or etched contours, commonly used to promote adhesion to mold compounds. Thus, the lead frame 121 may be formed by stamping, which may reduce a fabrication cost for the lead frame 121, and thus may reduce a fabrication cost for the microelectronic device 100. Other materials for the lead frame 121 and methods of forming the lead frame 121 are within the scope of this example.

The inner gull-wing leads 122a and the outer gull-wing leads 122b are attached to the intermediate pads 107 at ends of the inner gull-wing leads 122a and the outer gull-wing leads 122b opposite from the corresponding external attachment surfaces 123, while the inner gull-wing leads 122a and the outer gull-wing leads 122b are attached to the lead frame 121. The inner gull-wing leads 122a and the outer gull-wing leads 122b may be attached to the intermediate pads 107 by bringing the inner gull-wing leads 122a and the outer gull-wing leads 122b into contact with the solder 120, and subsequently heating the solder 120 to form a solder joint that connects the inner gull-wing leads 122a and the outer gull-wing leads 122b to the intermediate pads 107. The barrier layer 117 of FIG. 1I, of the intermediate pads 107, may advantageously reduce diffusion of copper in the base layer 116 of FIG. 1I of the intermediate pads 107 into the solder joint between the intermediate pads 107 and the inner gull-wing leads 122a and the outer gull-wing leads 122b, thus providing improved reliability for the microelectronic device 100. In versions of this example in which the solder 120 is omitted, the inner gull-wing leads 122a and the outer gull-wing leads 122b are attached to the intermediate pads 107 by another process, for example, microwelding, or bonding with an electrically conductive adhesive.

After the inner gull-wing leads 122a and the outer gull-wing leads 122b are attached to the intermediate pads 107, the inner gull-wing leads 122a and the outer gull-wing leads 122b are severed from the lead frame 121 of FIG. 1J. The inner gull-wing leads 122a and the outer gull-wing leads 122b may be severed from the lead frame 121 by a shearing process, by a laser ablation process, or by another method.

Figure 1K:
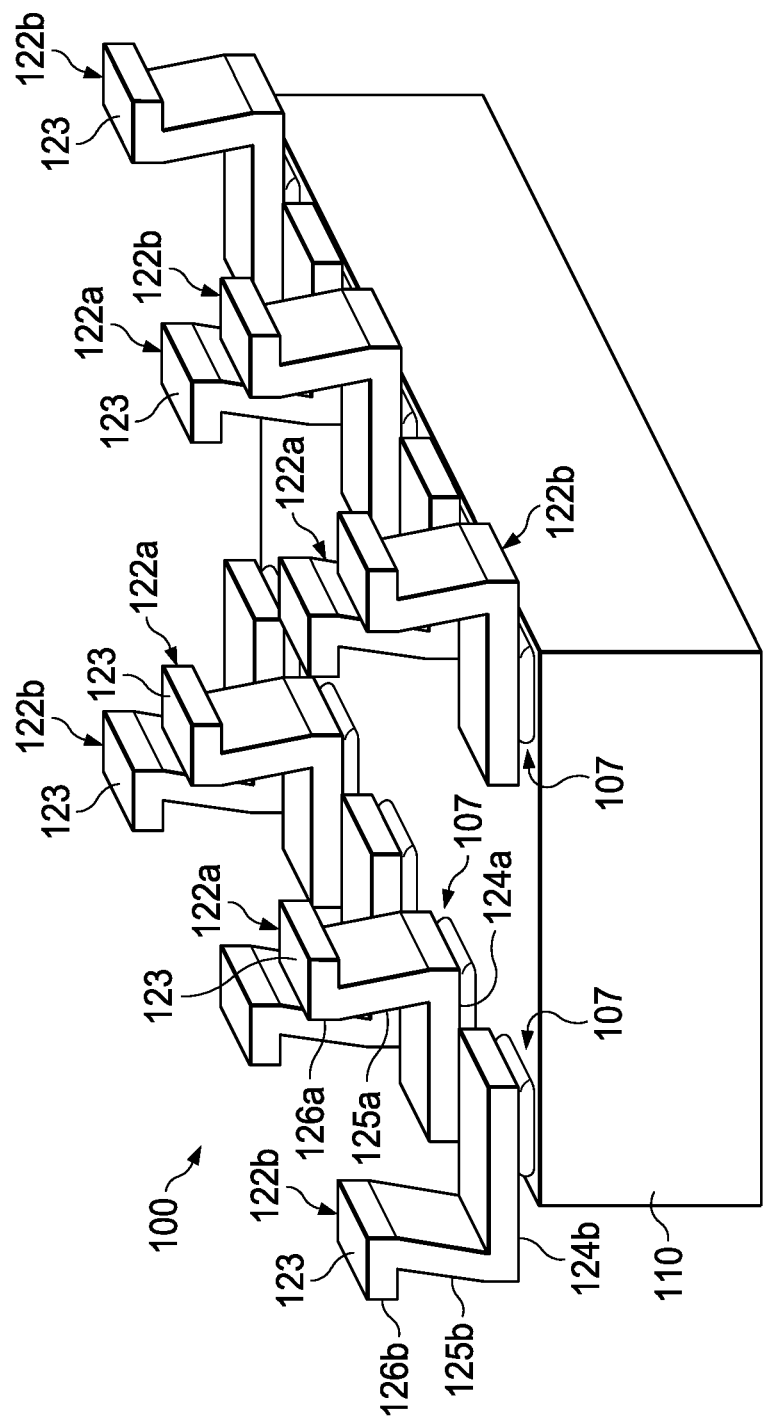

FIG. 1K depicts the completed microelectronic device 100. Each of the inner gull-wing leads 122a has a first portion 124a which contacts the corresponding intermediate pad 107, a second portion 125a continuous with the first portion 124a and extending away from the intermediate pad 107, and a third portion 126a continuous with the second portion 125a, opposite from the first portion 124a. The third portion 126a includes the external attachment surface 123. The first portion 124a extends laterally in a first direction from a boundary with the second portion 125a. In this case, the term "laterally" refers to a direction parallel to a surface of the encapsulation material 110 containing the intermediate pads 107. The third portion 126a extends laterally in a second direction, opposite from the first direction, from a boundary with the second portion 125a. The third portion 126a is not coplanar with the first portion 124a, being offset by the second portion 125a.

Similarly, each of the outer gull-wing leads 122b has a first portion 124b which contacts the corresponding intermediate pad 107, a second portion 125b continuous with the first portion 124b and extending away from the intermediate pad 107, and a third portion 126b continuous with the second portion 125b, opposite from the first portion 124b. The first portion 124b, the second portion 125b, and the third portion 126b of each of the outer gull-wing leads 122b has the same spatial relationships with respect to the surface of the encapsulation material 110 containing the intermediate pads 107 and to each other as the first portion 124a, the second portion 125a, and the third portion 126a of each of the inner gull-wing leads 122a.

The external attachment surfaces 123 of the outer gull-wing leads 122b are located outside of the external attachment surfaces 123 of the inner gull-wing leads 122a, that is, the external attachment surface 123 of each outer gull-wing lead 122b is located farther from a center of the die 103 of FIG. 1I than the external attachment surface 123 of an inner gull-wing lead 122a located adjacent to the outer gull-wing lead 122b, providing a multirow gull-wing configuration. The multirow gull-wing configuration may advantageously enable locating the external attachment surfaces 123 in a smaller area than a comparable device having a single row configuration, while maintaining benefits of the gull-wing lead shape.

Figure 2A:
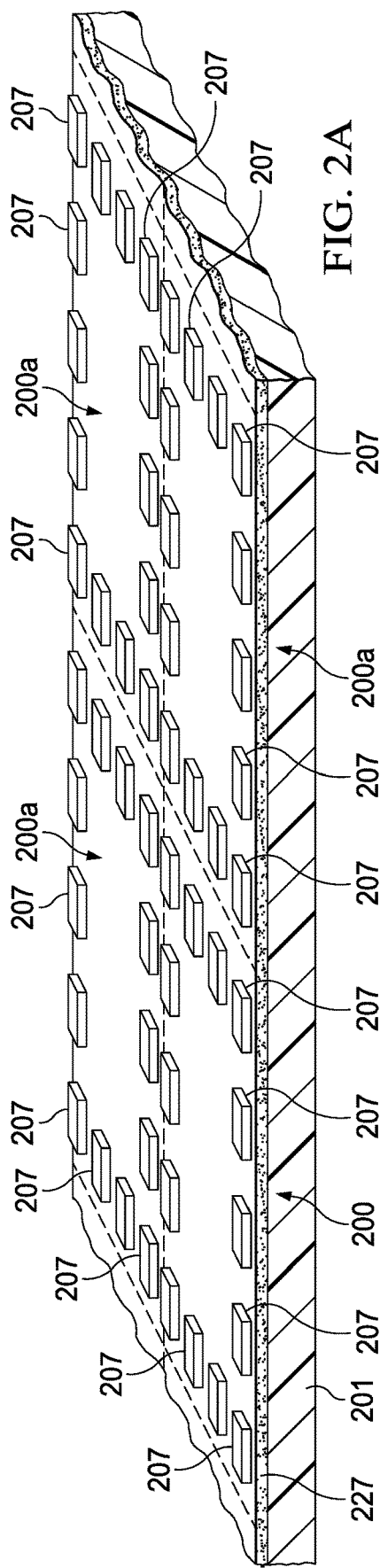
FIG. 2A through FIG. 2J include perspectives and cross sections of a microelectronic device having a leaded/leadless chip scale package, depicted in stages of another example method of formation.

FIG. 2A through FIG. 2J include perspectives and cross sections of a microelectronic device having a leaded/leadless chip scale package, depicted in stages of another example method of formation. Referring to FIG. 2A, formation of the microelectronic device 200 begins by providing a carrier 201. The carrier 201 includes one or more materials suitable as a substrate for forming wire bond studs. In this example, the carrier 201 may be rigid, to facilitate formation of the wire bond studs. The carrier 201 may include, for example, glass, sapphire, silicon, metal, or ceramic. The carrier 201 may have a laminated structure, with a thin, hard surface layer, attached to a mechanically durable substrate. Other compositions and structures for the carrier 201 are within the scope of this example. The carrier 201 may have alignment marks, not shown in FIG. 2A, to assist subsequent placement of die on the carrier 201.

A releasable adhesive 227 is disposed on the carrier 201. The releasable adhesive 227 may include, for example, a thermolabile material, which reduces adhesion of the releasable adhesive 227 upon being heated to a prescribed temperature. Commercially available adhesives with thermolabile materials have a range of prescribed temperatures, from 75° C. to 200° C. Other manifestations of the releasable adhesive 227, such as photolabile material, which reduces adhesion of the releasable adhesive 227 upon exposure to light in a prescribed wavelength band, are within the scope of this example.

Intermediate pads 207 are disposed on the releasable adhesive 227 in areas for the microelectronic device 200 and in separate areas for additional microelectronic devices 200a. The intermediate pads 207 of the instant example may be implemented as preformed metal pads. The intermediate pads 207 may be individually placed on the releasable adhesive 227, or may be applied in a preconfigured pattern using a tape backing. The intermediate pads 207 of the instant example are disposed on the releasable adhesive 227 without using a photolithographic process, which may advantageously reduce a fabrication cost and a fabrication complexity of the microelectronic device 200. The intermediate pads 207 may include layers to facilitate wire bonding, provide low resistance, and reduce formation of intermetallic compounds. For example, the intermediate pads 207 may include a barrier layer on the releasable adhesive 227 to reduce diffusion of copper in the intermediate pads 207 and tin in a subsequently-formed solder joint, so as to mitigate formation of copper-tin intermetallic compounds. Formation of copper-tin intermetallic compounds is linked to reduced reliability. The intermediate pads 207 may further include a base layer of copper or a copper alloy, over the barrier layer, to provide a desired low resistance in the intermediate pads 207. The base layer may be, for example, 50 microns to 250 microns thick. Copper or a copper alloy is advantageous for the base layer, due to a combination of low cost and low resistance, compared to gold, nickel, or silver. The intermediate pads 207 may also include a wire bondable layer over the base layer, to provide an oxidation-resistant surface for wire bonding. The wire bondable layer may include, for example, gold or platinum, and may be 100 nanometers to 2 microns thick. The intermediate pads 207 may include an adhesion layer of titanium or a titanium alloy between the base layer and the wire bondable layer to provide adhesion of the wire bondable layer to the base layer and reduce diffusion of copper from the base layer into the wire bondable layer.

Figure 2B:
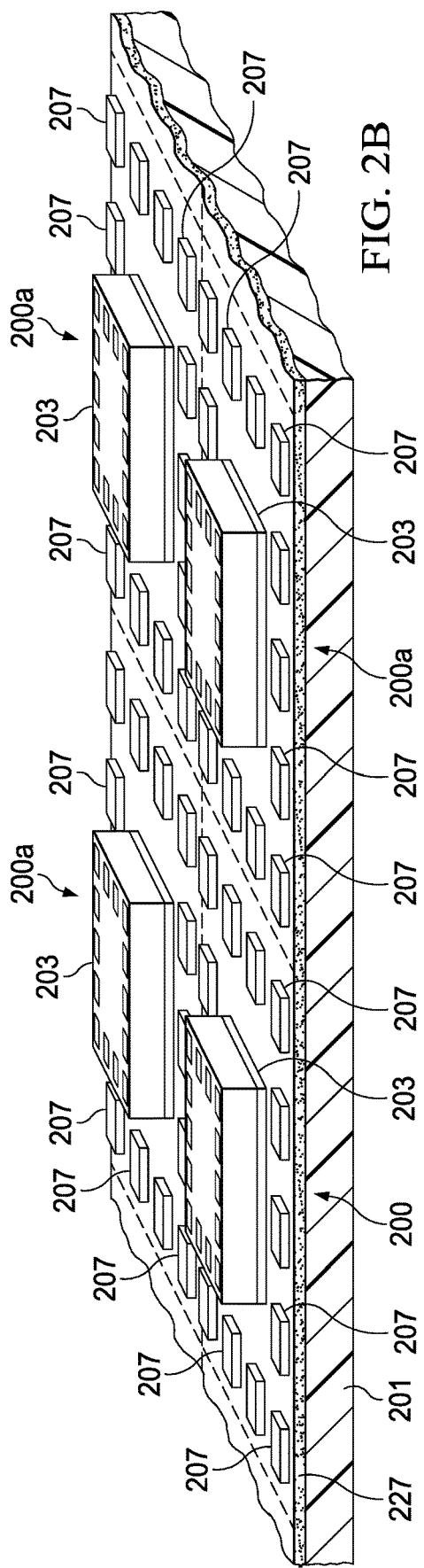

Referring to FIG. 2B, multiple die 203 are attached to the releasable adhesive 227. One of the die 203 is attached to the carrier 201 in an area for the microelectronic device 200, and additional die 203 are attached to the carrier 201 in separate areas for additional microelectronic devices 200a. The die 203 may be manifested as integrated circuits, discrete semiconductor components, electro-optical devices, MEMS devices, or other microelectronic die. The die 203 may all be substantially similar devices, or may include more than one device type. The die 203 are positioned adjacent to the intermediate pads 207 for the corresponding microelectronic devices 200 and 200a.

Figure 2C:
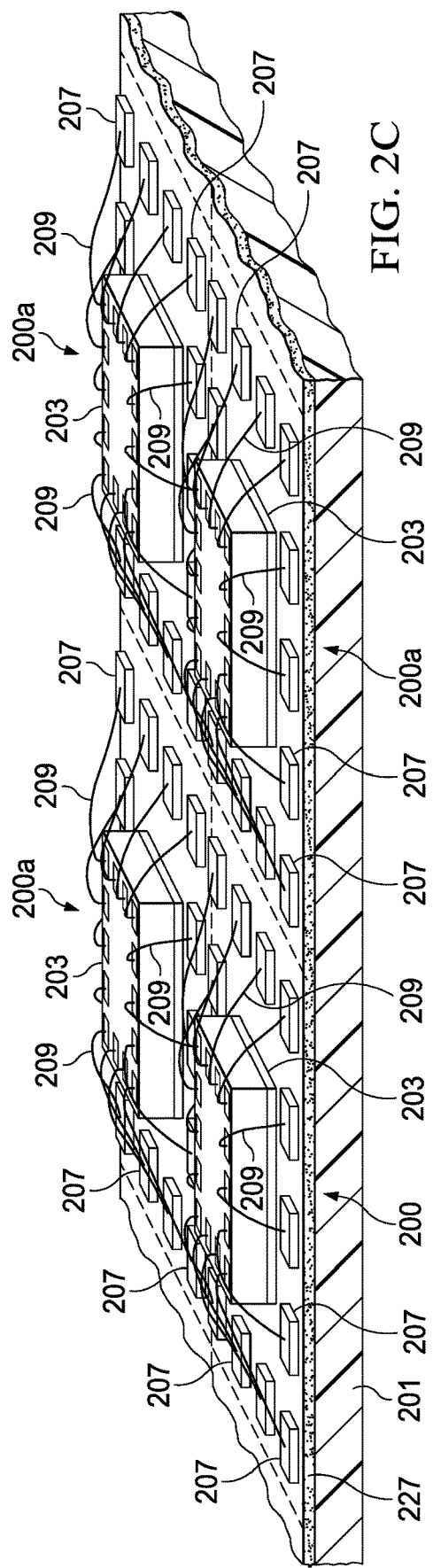

Referring to FIG. 2C, wire bonds 209 are formed by a wire bonding process to connect the die 203 to the intermediate pads 207. FIG. 2C depicts the wire bonds 209 as formed using round bond wire. Other types of bond wire, such as ribbon bond wire, are within the scope of this example. The wire bonds 209 may include, for example, copper wire, coated copper wire, gold wire, or aluminum wire. The wire bonds 209 may be formed with ball bonds on the die 203 and stitch bonds on the intermediate pads 207, or may be formed with ball bonds on the intermediate pads 207 and stitch bonds on the die 203. The die 203 may have terminals 205, shown in more detail in FIG. 2G, for electrical connections to components in the die 203. The wire bonds 209 may terminate on the terminals 205.

Figure 2D:
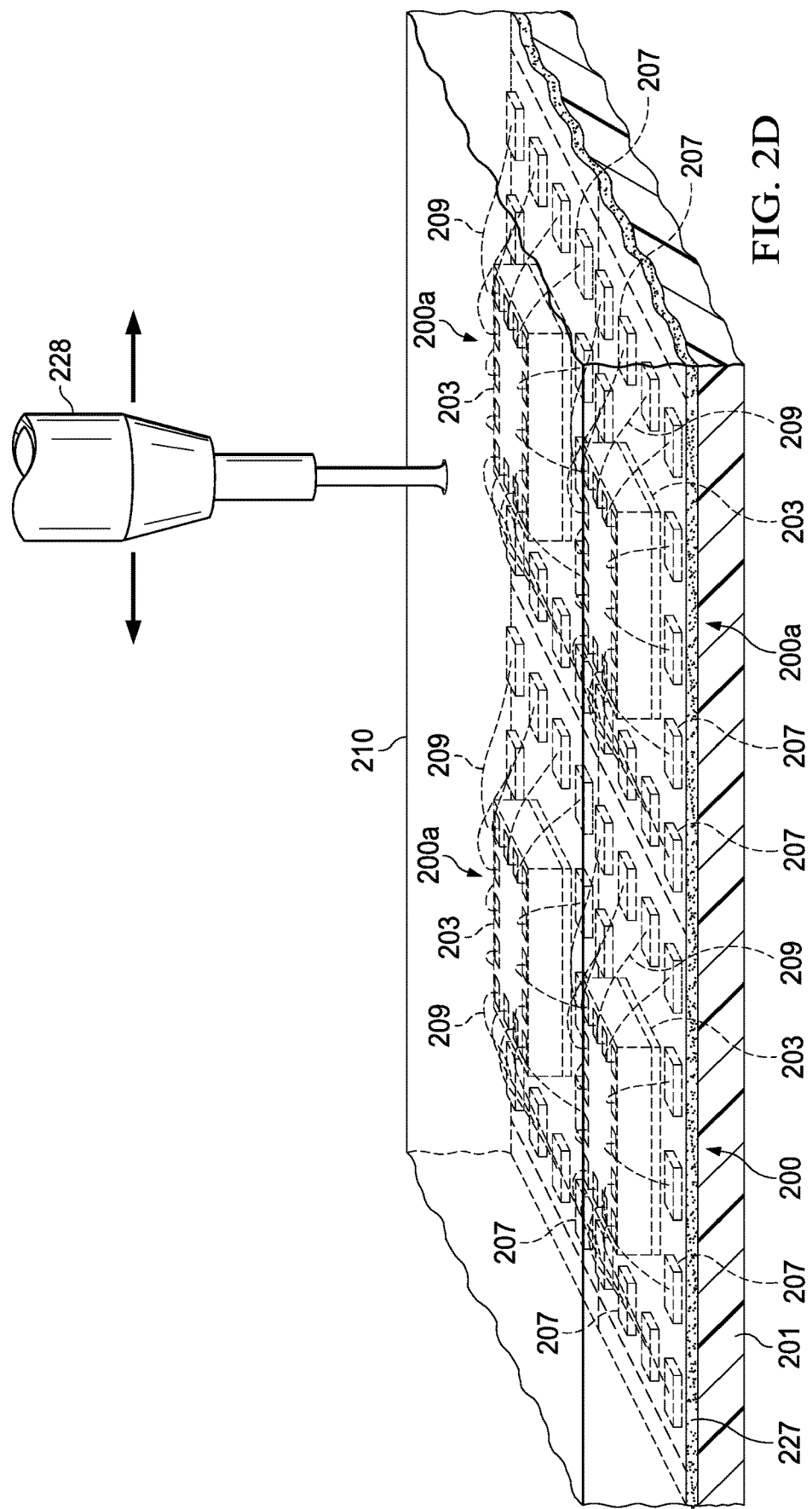

Referring to FIG. 2D, an encapsulation material 210 is formed over the die 203, the wire bonds 209, and the intermediate pads 207. The encapsulation material 210 contacts the intermediate pads 207. The encapsulation material 210 may include epoxy or other material suitable for protecting the die 203 and the wire bonds 209 from moisture and contamination. The encapsulation material 210 may be formed by an additive process using a material extrusion apparatus 228. Alternatively, the encapsulation material 210 may be formed by injection molding, by press molding, or by other methods. The encapsulation material 210 extends to the carrier 201 adjacent to the die 203 and adjacent to the intermediate pads 207.

Figure 2E:
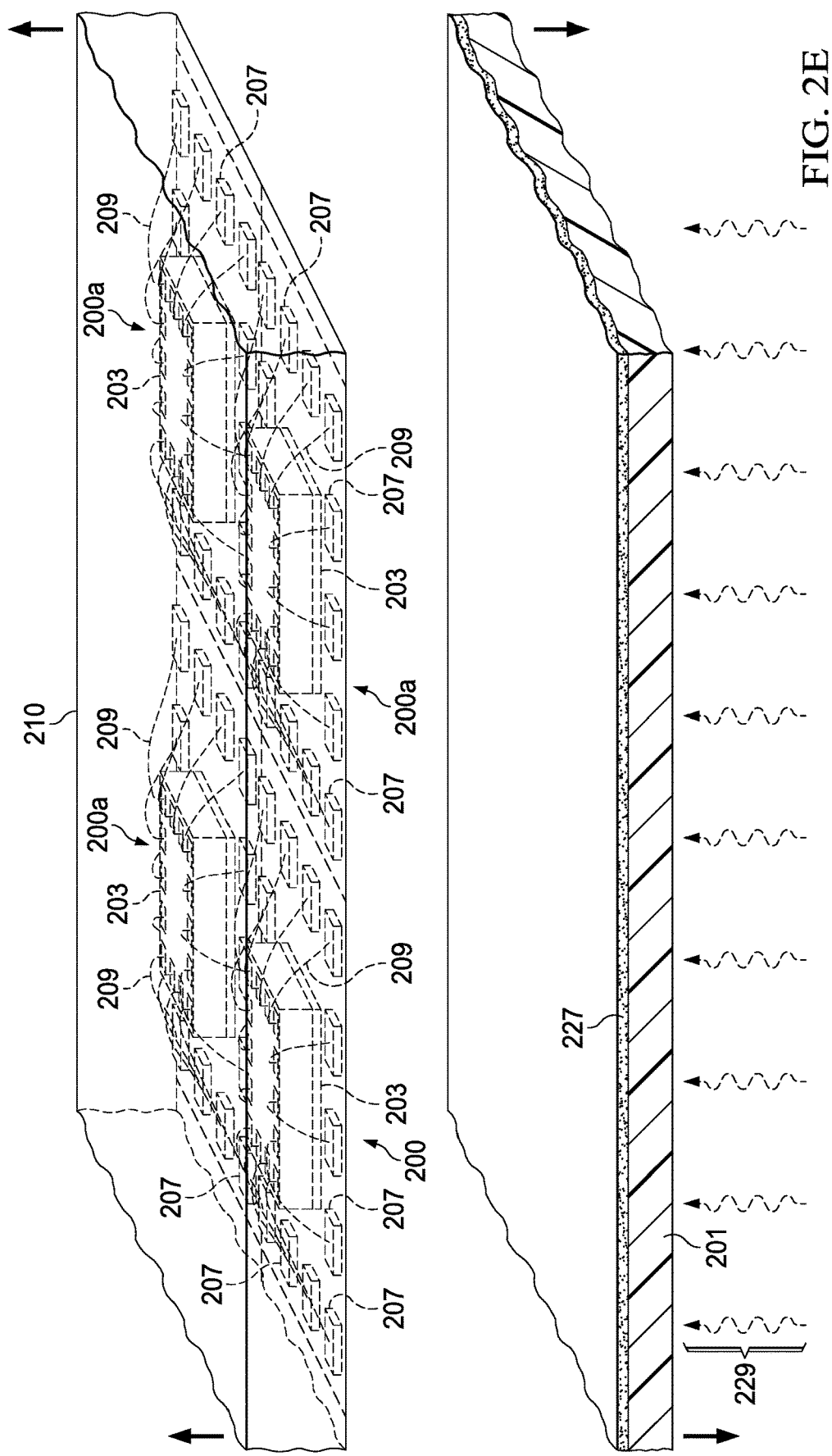

Referring to FIG. 2E, the carrier 201 and the releasable adhesive 227 are removed from the microelectronic device 200 by separating the releasable adhesive 227 from the encapsulation material 210 and from the intermediate pads 207. In the case of the releasable adhesive 227 being implemented with a thermolabile material, removal of the carrier 201 and the releasable adhesive 227 may be performed in this example by heating the releasable adhesive 227 by a heating process 229 to a prescribed temperature, as indicated in FIG. 2E. The heating process 229 may be implemented as a radiative heating process, as indicated in FIG. 2E, or may be implemented as a hot plate process, a forced air convection heating process, or an oven bake process. In the case of the releasable adhesive 227 being implemented with a photolabile material, the carrier 201 and the releasable adhesive 227 may be removed by exposure to light in a prescribed wavelength band, through the carrier 201. In the case of the releasable adhesive 227 being implemented with other materials, other methods for removing the carrier 201 and the releasable adhesive 227, may be used as appropriate. Removal of the releasable adhesive 227 exposes the intermediate pads 207.

Figure 2F:
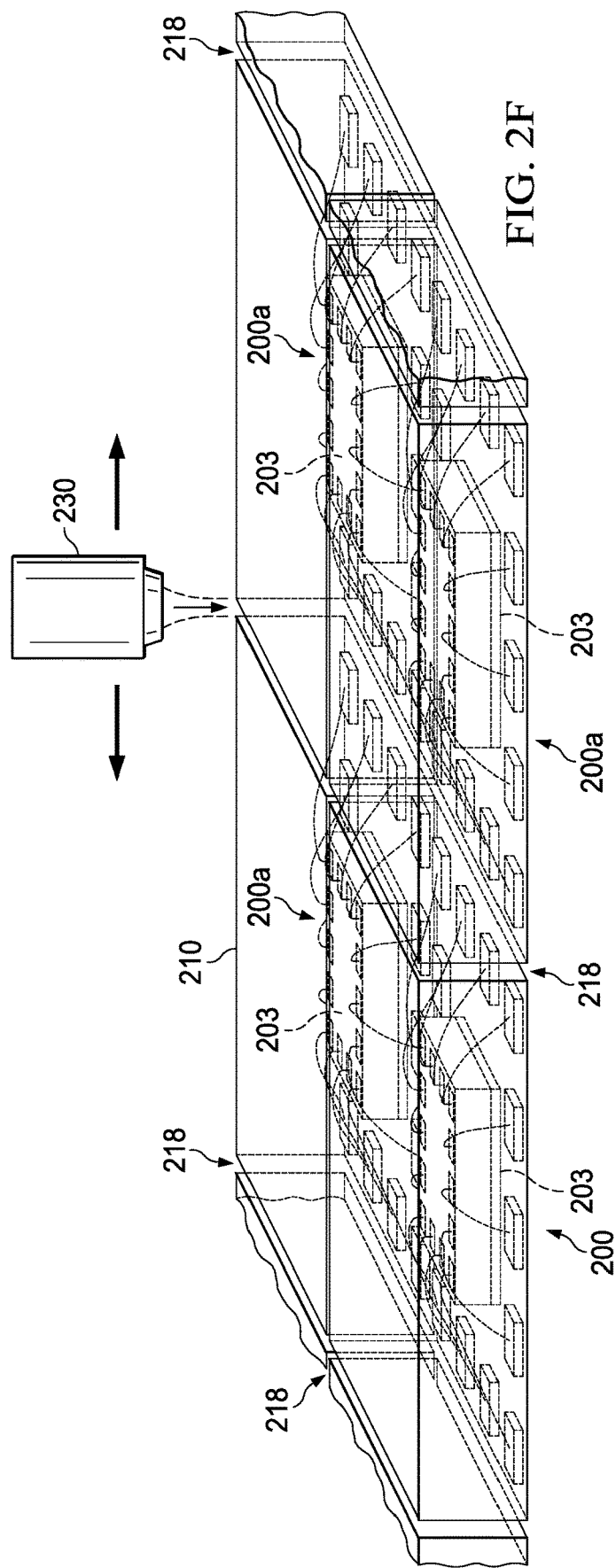

Referring to FIG. 2F, the microelectronic device 200 is singulated from the additional microelectronic devices 200a by cutting through the encapsulation material 210 in singulation lanes 218 between the microelectronic device 200 and the additional microelectronic devices 200a. The microelectronic device 200 may be singulated by a laser ablation process using a laser 230, as indicated in FIG. 2H. Singulating the microelectronic device 200 may be facilitated by the absence of metal in the singulation lanes 218.

Figure 2G:
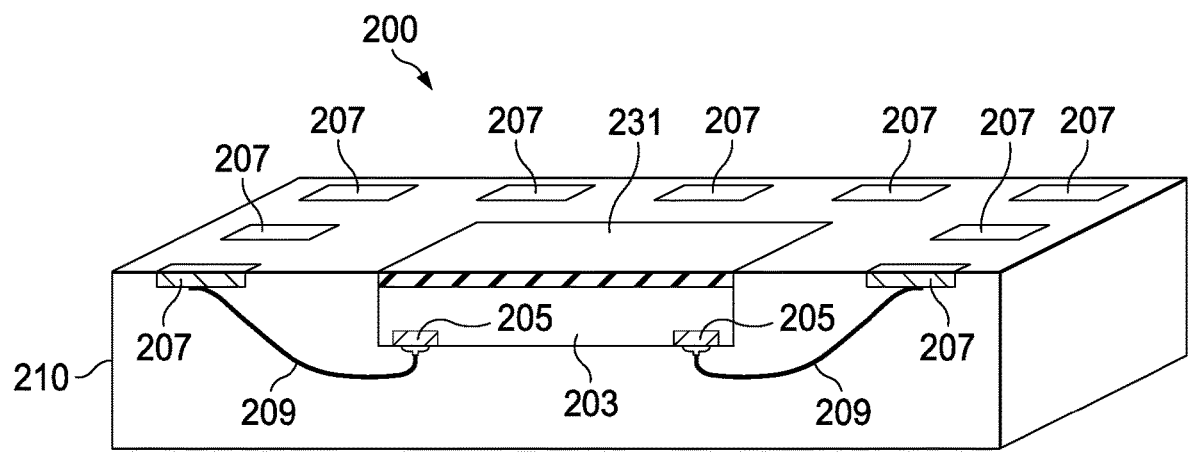
Figure 2H:
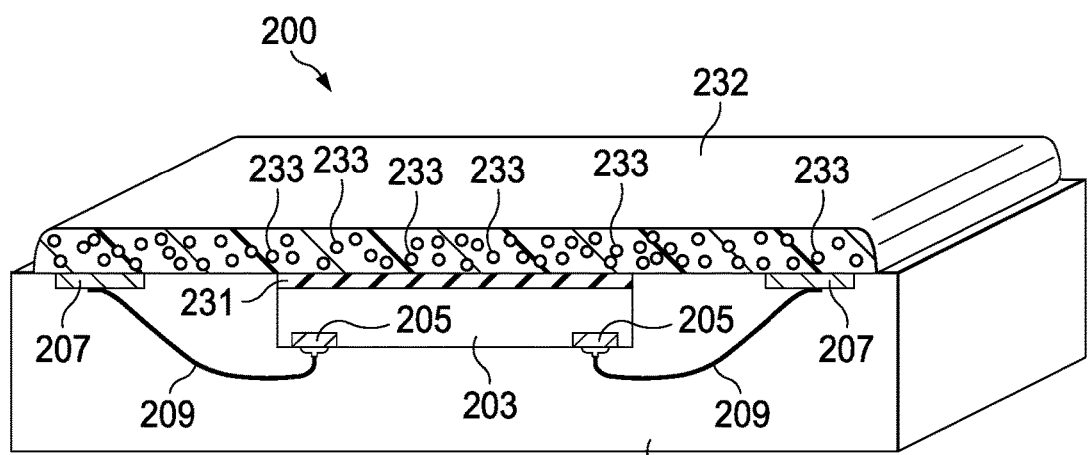

FIG. 2G depicts the microelectronic device 200 after singulating from the additional microelectronic devices 200a of FIG. 2F. The microelectronic device 200 is depicted in FIG. 2G in an inverted orientation with respect to FIG. 2F. The die 203 may have terminals 205 on which the wire bonds 209 are terminated. The terminals 205 may be manifested as bond pads, or circuit nodes. The terminals 205 may include materials suitable for wire bonding.

The die 203 may have an electrically insulating layer 231 to isolate electrical conductors and semiconductor material in the die 203 from exposure to an exterior of the microelectronic device 200. The electrically insulating layer 231 may include, for example, silicon dioxide, silicon nitride, or polyimide.

Referring to FIG. 2H, in this example, a solder anisotropic conductive film 232 is applied to the microelectronic device 200, contacting the intermediate pads 207. The solder anisotropic conductive film 232 may include solder particles 233 in an adhesive binder. The solder anisotropic conductive film 232 may be applied in a tape format, or may be applied in a paste format. The solder anisotropic conductive film 232 is commercially available from various suppliers.

Figure 2I:
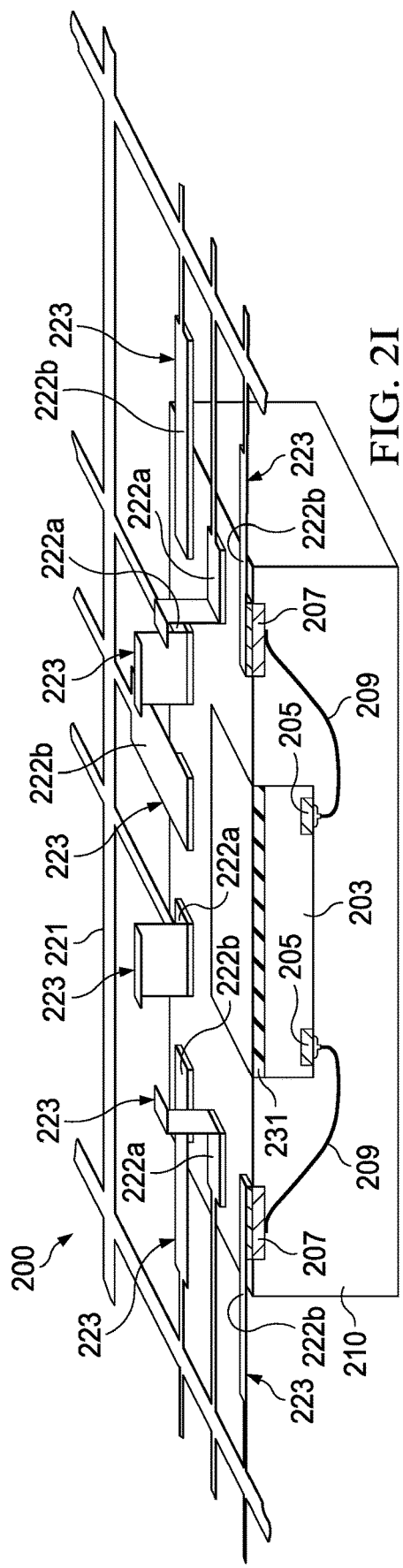

Referring to FIG. 2I, a lead frame 221 is provided with inner gull-wing leads 222a and outer gull-wing leads 222b. In this example, both the inner gull-wing leads 222a may be formed into gull-wing shapes before the inner gull-wing leads 222a and the outer gull-wing leads 222b are attached to the intermediate pads 207, while the outer gull-wing leads 222b may be left flat to maintain continuity with the lead frame 221. Each of the inner gull-wing leads 222a and the outer gull-wing leads 222b has an external attachment surface 223. The inner gull-wing leads 222a and the outer gull-wing leads 222b are not constrained by requirements for wire bonding, such as tight spacing or wire bondable surfaces, and so may have relaxed dimensions and less expensive surface materials compared to leads used for wire bonding. The lead frame 221 may include, for example, stainless steel, or copper clad with stainless steel, to provide a desired balance between mechanical strength and electrical resistance. The inner gull-wing leads 222a and the outer gull-wing leads 222b do not require surface features to provide adhesion to mold compounds, such as roughened surface areas or etched contours, commonly used to promote adhesion to mold compounds. Thus, the lead frame 221 may be formed by stamping, which may reduce a fabrication cost for the lead frame 221, and thus may reduce a fabrication cost for the microelectronic device 200. Other materials for the lead frame 221 and methods of forming the lead frame 221 are within the scope of this example.

The inner gull-wing leads 222a and the outer gull-wing leads 222b are attached to the intermediate pads 207, at ends of the inner gull-wing leads 222a and the outer gull-wing leads 222b opposite from the corresponding external attachment surfaces 223, while the inner gull-wing leads 222a and the outer gull-wing leads 222b remain connected to the lead frame 221. The inner gull-wing leads 222a and the outer gull-wing leads 222b may be attached to the intermediate pads 207 by bringing the inner gull-wing leads 222a and the outer gull-wing leads 222b into contact with the solder anisotropic conductive film 232 of FIG. 2H, and subsequently heating the solder anisotropic conductive film 232 to melt the solder particles 233 of FIG. 2H to form a solder joint that connects the inner gull-wing leads 222a and the outer gull-wing leads 222b to the intermediate pads 207. The barrier layer of the intermediate pads 207 may advantageously reduce diffusion of copper in the base layer of the intermediate pads 207 into the solder joint between the intermediate pads 207 and the inner gull-wing leads 222a and the outer gull-wing leads 222b, thus providing improved reliability for the microelectronic device 200. In versions of this example in which the solder anisotropic conductive film 232 is omitted, the inner gull-wing leads 222a and the outer gull-wing leads 222b are attached to the intermediate pads 207 by another process, for example, microwelding, or bonding with an electrically conductive adhesive.

Figure 2J:
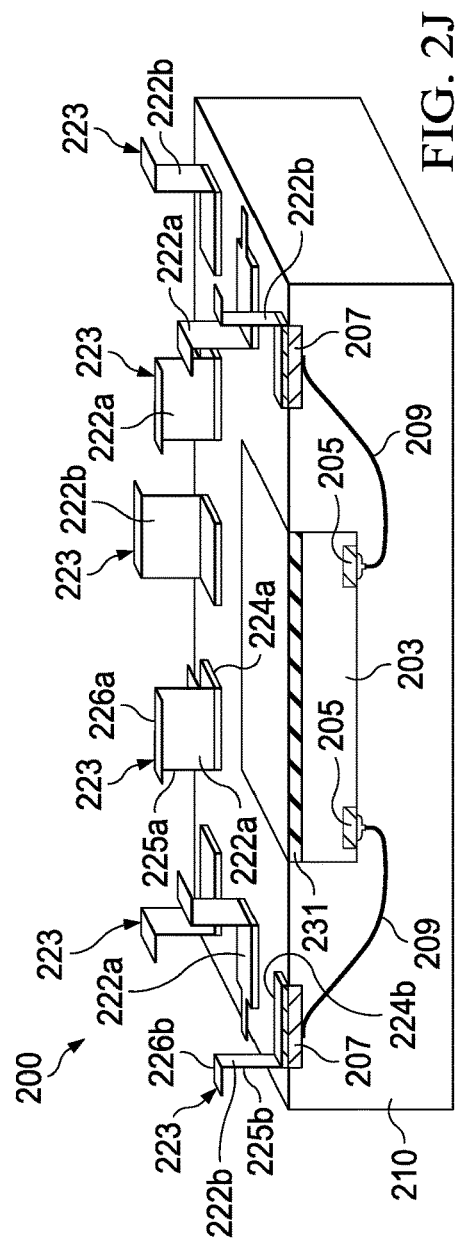

Referring to FIG. 2J, the outer gull-wing leads 222b are severed from the lead frame 221 of FIG. 2I. The outer gull-wing leads 222b may be severed from the lead frame 221 by any of the processes disclosed in reference to FIG. 1J. The outer gull-wing leads 222b are subsequently formed into gull-wing shapes.

FIG. 2J depicts the completed microelectronic device 200. Each of the inner gull-wing leads 222a has a first portion 224a which contacts the corresponding intermediate pad 207, a second portion 225a continuous with the first portion 224a and extending away from the intermediate pad 207, and a third portion 226a continuous with the second portion 225a, opposite from the first portion 224a. The third portion 226a includes the external attachment surface 223. The first portion 224a extends laterally in a first direction from a boundary with the second portion 225a. In this case, the term "laterally" refers to a direction parallel to a surface of the encapsulation material 210 containing the intermediate pads 207. The third portion 226a extends laterally in a second direction, opposite from the first direction, from a boundary with the second portion 225a. The third portion 226a is not coplanar with the first portion 224a, being offset by the second portion 225a.

Similarly, each of the outer gull-wing leads 222b has a first portion 224b which contacts the corresponding intermediate pad 207, a second portion 225b continuous with the first portion 224b and extending away from the intermediate pad 207, and a third portion 226b continuous with the second portion 225b, opposite from the first portion 224b. The first portion 224b, the second portion 225b, and the third portion 226b of each of the outer gull-wing leads 222b has the same spatial relationships with respect to the surface of the encapsulation material 210 containing the intermediate pads 207 and to each other as the first portion 224a, the second portion 225a, and the third portion 226a of each of the inner gull-wing leads 222a.

The external attachment surfaces 223 of the outer gull-wing leads 222b are located outside of the external attachment surfaces 223 of the inner gull-wing leads 222a, that is, the external attachment surface 223 of each outer gull-wing lead 222b is located farther from a center of the die 203 than the external attachment surface 223 of an inner gull-wing lead 222a located adjacent to the outer gull-wing lead 222b, providing a multirow gull-wing configuration. In this example, the inner gull-wing leads 222a and the outer gull-wing leads 222b are both located on four sides of the microelectronic device 200. The multirow gull-wing configuration may advantageously enable locating the external attachment surfaces 223 in a smaller area than a comparable device having a single row configuration, while maintaining benefits of the gull-wing lead shape.

Figure 3C:
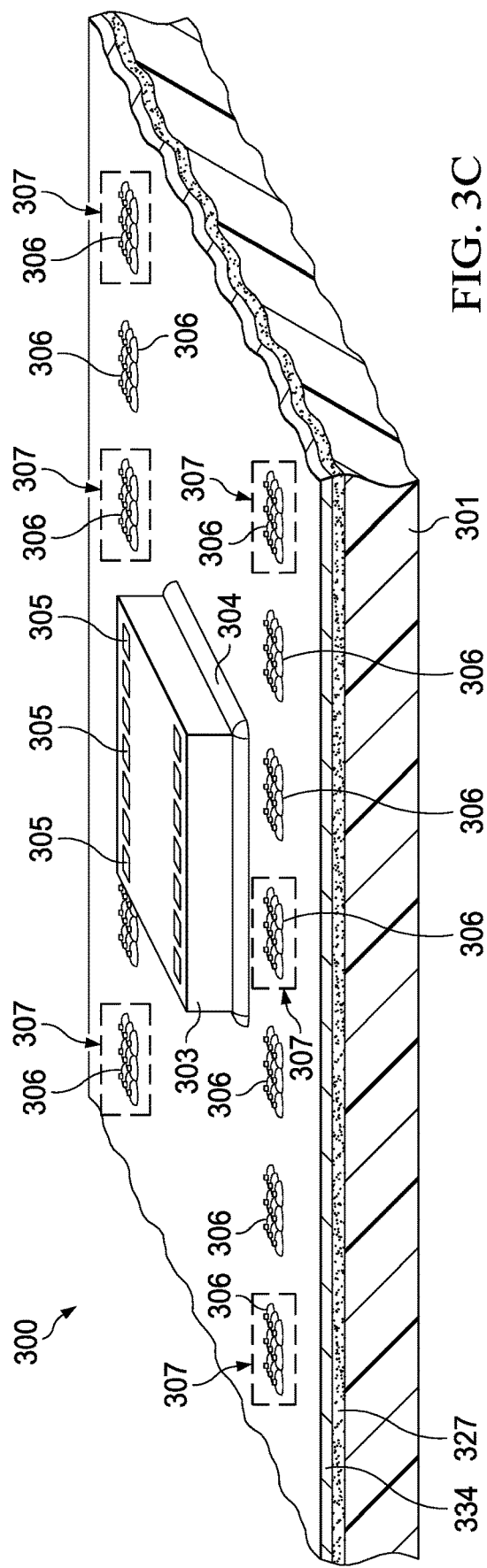

FIG. 3A through FIG. 3K include various views of a microelectronic device having a multirow gull-wing chip scale package, depicted in stages of a further example method of formation. Referring to FIG. 3A, formation of the microelectronic device 300 begins by providing a carrier 301. The carrier 301 includes one or more materials suitable as a substrate for forming wire bond studs. In this example, the carrier 301 may be flexible, to facilitate subsequent removal from the microelectronic device 300. The carrier 301 may include, for example, polycarbonate, high density polyethylene, polydimethylsiloxane (PDMS), or polyurethane. The carrier 301 may be reinforced with fibers, such as glass fibers, to provide mechanical integrity. Other compositions and structures for the carrier 301 are within the scope of this example. The carrier 301 includes an area for the microelectronic device 300, and further includes area for additional microelectronic devices 300a. The carrier 301 may have alignment marks 302 to assist subsequent placement of die on the carrier 301.

A releasable adhesive 327 is disposed on the carrier 301. The releasable adhesive 327 may include, for example, a thermolabile material, which reduces adhesion of the releasable adhesive 327 upon being exposed to a temperature in a prescribed range, for example 75° C. to 200° C., depending on the composition of the thermolabile material. Other manifestations of the releasable adhesive 327, such as a releasable adhesive 327 which includes a photolabile material, are within the scope of this example.

A pad metal layer 334 is disposed on the releasable adhesive 327. The pad metal layer 334 includes metal suitable for forming wire bond studs or ribbon bond wire stitch strips. The pad metal layer 334 also includes metal suitable for forming a seed layer for a subsequent plating process. The pad metal layer 334 may have several sublayers of metal, for example a protective layer of nickel, gold, platinum, or palladium that contacts the releasable adhesive 327, a base layer of copper or copper alloy on the protective layer, and a wire bondable layer of gold or platinum on the base layer. The base layer may be for example, 50 microns to 250 microns thick.

FIG. 3B depicts the area of the carrier 301 for the microelectronic device 300. A die 303 is attached to the pad metal layer 334 in an area for the microelectronic device 300. Additional die are attached to the pad metal layer 334 in the areas for the additional microelectronic devices 300a, shown in FIG. 3A. The die 303 may be manifested as an integrated circuit, a discrete semiconductor component, an electro-optical device, a MEMS device, or another microelectronic die.

The die 303 may be attached to the pad metal layer 334 by a die attach material 304, such as an electrically conductive adhesive or solder. The die attach material 304 of this example is electrically non-conductive, to isolate a substrate of the die 303 from the pad metal layer 334.

The die 303 may have terminals 305 for electrical connections to components in the die 303. The terminals 305 may be manifested as bond pads, or may be manifested as circuit nodes, such as transistor source and drain nodes. The terminals 305 may include materials suitable for wire bonding, such as aluminum, copper, gold, or platinum.

Referring to FIG. 3C, wire bond studs 306 are formed on the pad metal layer 334 adjacent to the die 303, using a wire bonding process. The wire bond studs 306 may be formed by pressing a free air ball of a bond wire onto the pad metal layer 334 with a wire bonding capillary to form a stud, and subsequently severing the bond wire proximate to the stud. The wire bond studs 306 may include primarily copper or gold, and may have some nickel or palladium from a barrier layer around the bond wire. The wire bond studs 306 and portions of the pad metal layer 334 immediately below the wire bond studs 306 form initial portions of intermediate pads 307.

Figure 3E:
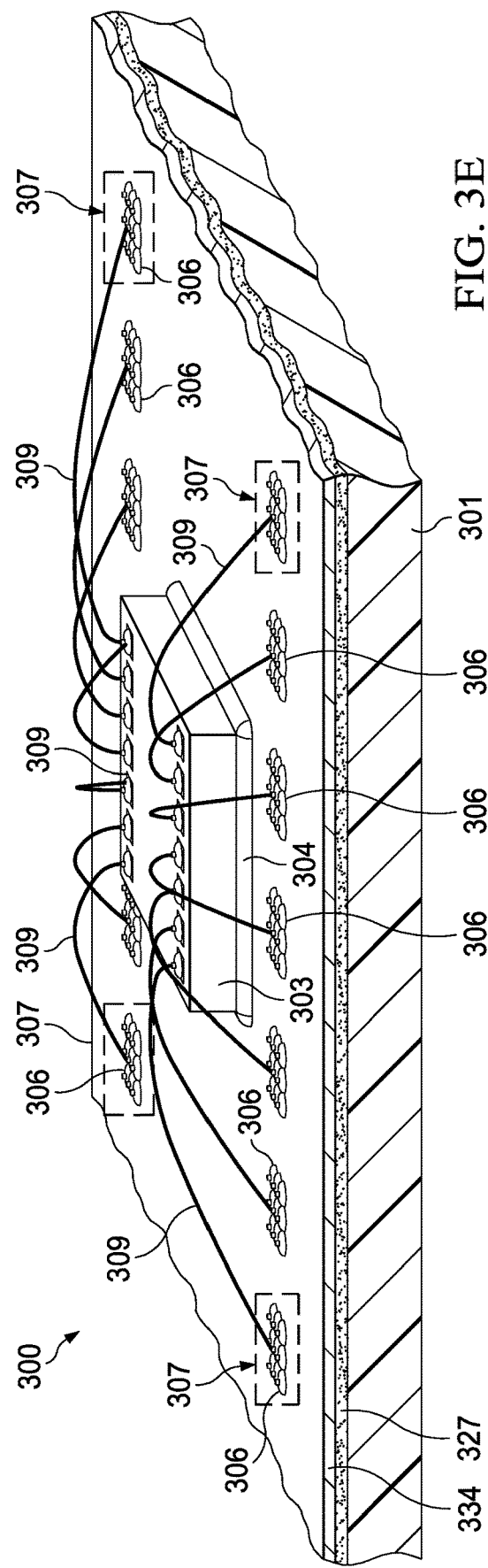
Figure 3D:
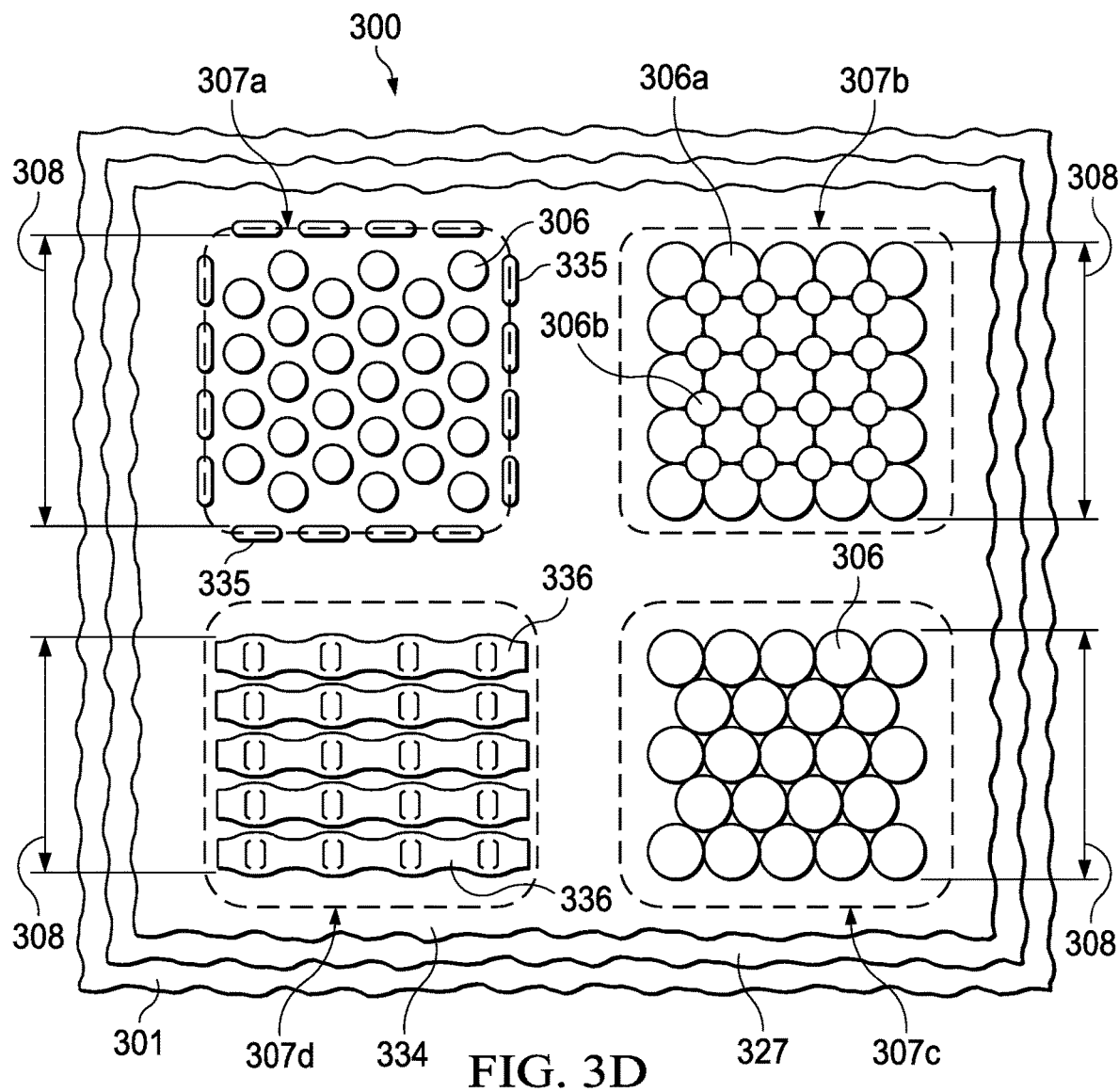

FIG. 3D depicts example configurations of the intermediate pads 307 of FIG. 3C. A first intermediate pad 307a may be implemented as a hexagonal array of wire bond studs 306 of substantially equal sizes, as a result of being formed with equal diameter bond wire and equal force on the wire bonding capillary. Adjacent wire bond studs 306 may be separated from each other in the first intermediate pad 307a, by a space that is sufficiently small that the pad metal layer 334 will remain connected to, and continuous between, the adjacent wire bond studs 306 when the carrier 301 is removed from the microelectronic device 300. For example, the adjacent wire bond studs 306 may be separated by a space that is 1 to 5 times a thickness of the pad metal layer 334. The first intermediate pad 307a may have a minimum lateral dimension 308 of 150 microns to 300 microns. The term "lateral" refers to a direction parallel to a face of the pad metal layer 334 on which the wire bond studs 306 are formed. The minimum lateral dimension 308 may be selected to maintain current density through the first intermediate pad 307a, during operation of the microelectronic device 300, below a target value, to provide a desired level of reliability.

The first intermediate pad 307a includes a contiguous portion of the pad metal layer 334 contacting the wire bond studs 306. The pad metal layer 334 may include pad separation features 335 which surround the first intermediate pad 307a, to facilitate separation of the contiguous portion of the pad metal layer 334 of the first intermediate pad 307a from a remainder of the pad metal layer 334, when the carrier 301 is removed from the microelectronic device 300. The pad separation features 335 may be implemented as perforations through the pad metal layer 334, indentations in the pad metal layer 334, or other such structures that facilitate separation of the pad metal layer 334 around the first intermediate pad 307a.

A second intermediate pad 307b may have a square array configuration of first wire bond studs 306a of substantially equal first sizes, and second wire bond studs 306b of substantially equal second sizes, smaller than the first size. The second wire bond studs 306b may be disposed between the first wire bond studs 306a to provide a higher fill factor of electrically conductive material in the second intermediate pad 307b. Adjacent first wire bond studs 306a and second wire bond studs 306b contact each other in the second intermediate pad 307b, to form a contiguous electrically conductive array on the pad metal layer 334. The second intermediate pad 307b may have a minimum lateral dimension 308 of 150 microns to 300 microns, to provide desired level of reliability as explained in reference to the first intermediate pad 307a.

A third intermediate pad 307c may have a hexagonal configuration of wire bond studs 306 of substantially equal sizes. Adjacent wire bond studs 306 in the third intermediate pad 307c may contact each other, to facilitate retention of a contiguous portion of the pad metal layer 334 connected to the wire bond studs 306, when the carrier 301 is removed from the microelectronic device 300. The third intermediate pad 307c may have a minimum lateral dimension 308 of 150 microns to 300 microns.

A fourth intermediate pad 307d may have a parallel non-contacting configuration of ribbon stitch bond strips 336. The ribbon stitch bond strips 336 are formed of ribbon wire on the pad metal layer 334, using a ribbon bond wire bonding process. Adjacent ribbon stitch bond strips 336 in the fourth intermediate pad 307d may be separated by a lateral space that is sufficiently narrow, so that the pad metal layer 334 will remain connected to, and continuous between, the adjacent ribbon stitch bond strips 336 when the carrier 301 is removed from the microelectronic device 300. The fourth intermediate pad 307d may have a minimum lateral dimension 308 of 150 microns to 300 microns.

The pad separation features 335 may be implemented in versions of the second intermediate pad 307b, the third intermediate pad 307c, or the fourth intermediate pad 307d. Intra-pad wire bonds, disclosed in the commonly assigned U.S. patent application Ser. No. 16/225,106, filed concurrently with this application, may be implemented in versions of the first intermediate pad 307a, the second intermediate pad 307b, the third intermediate pad 307c, or the fourth intermediate pad 307d.

Referring to FIG. 3E, wire bonds 309 are formed by a wire bonding process to connect the die 303 to the intermediate pads 307. FIG. 3E depicts the wire bonds 309 as formed using round bond wire. Other types of bond wire, such as ribbon bond wire, are within the scope of this example. The wire bonds 309 may include, for example, copper wire, coated copper wire, gold wire, or aluminum wire. The wire bonds 309 may be formed with ball bonds on the die 303 and stitch bonds on the intermediate pads 307, or may be formed with ball bonds on the intermediate pads 307 and stitch bonds on the die 303. The wire bonds 309 may terminate on the wire bond studs 306, or may terminate on the pad metal layer 334 among the wire bonds 309 in the intermediate pads 307.

Figure 3F:
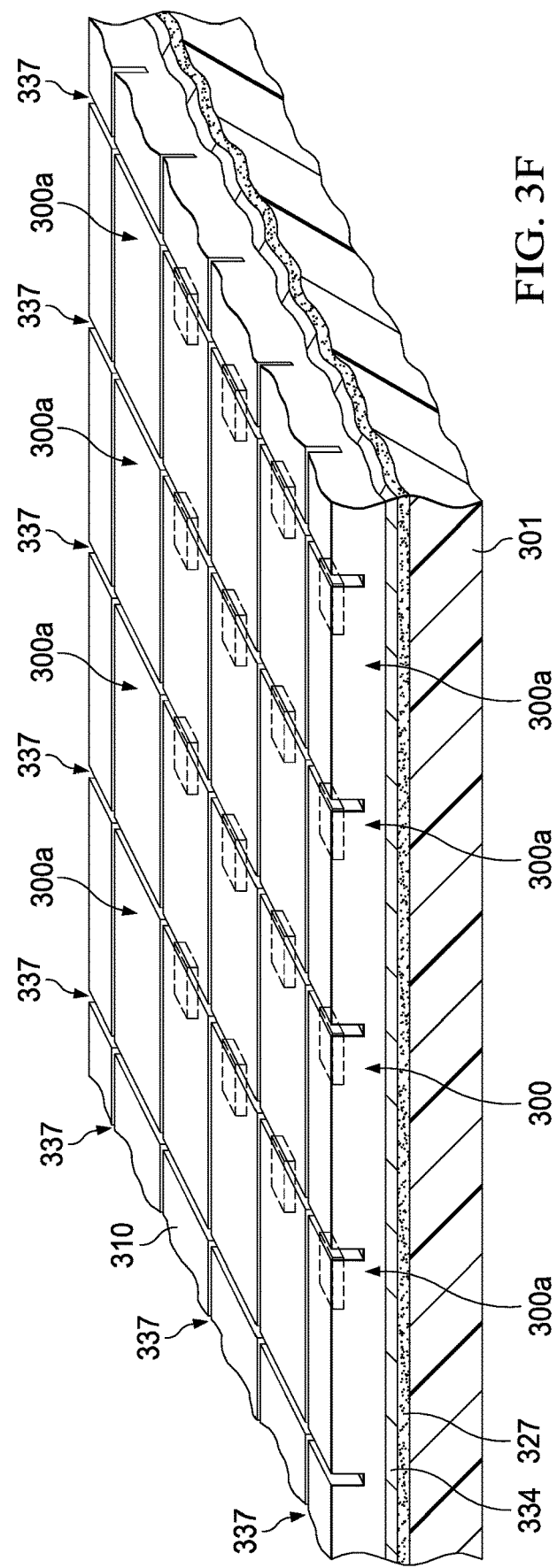

Referring to FIG. 3F, an encapsulation material 310 is formed over the die 303, the wire bonds 309, and the wire bond studs 306 of FIG. 3E. The encapsulation material 310 contacts the wire bond studs 306. The encapsulation material 310 may include epoxy or other material suitable for protecting the die 303 the wire bonds 309, and the wire bond studs 306 from moisture and contamination. In this example, the encapsulation material 310 may be formed by using a press mold having singulation fins, which produce singulation trenches 337 in the encapsulation material 310 between adjacent instances of the microelectronic device 300 and the additional microelectronic devices 300a. The singulation trenches 337 may facilitate subsequent singulation of the microelectronic device 300 from the additional microelectronic devices 300a. The encapsulation material 310 extends to the pad metal layer 334 adjacent to the die 303 and adjacent to the wire bond studs 306.

Figure 3G:
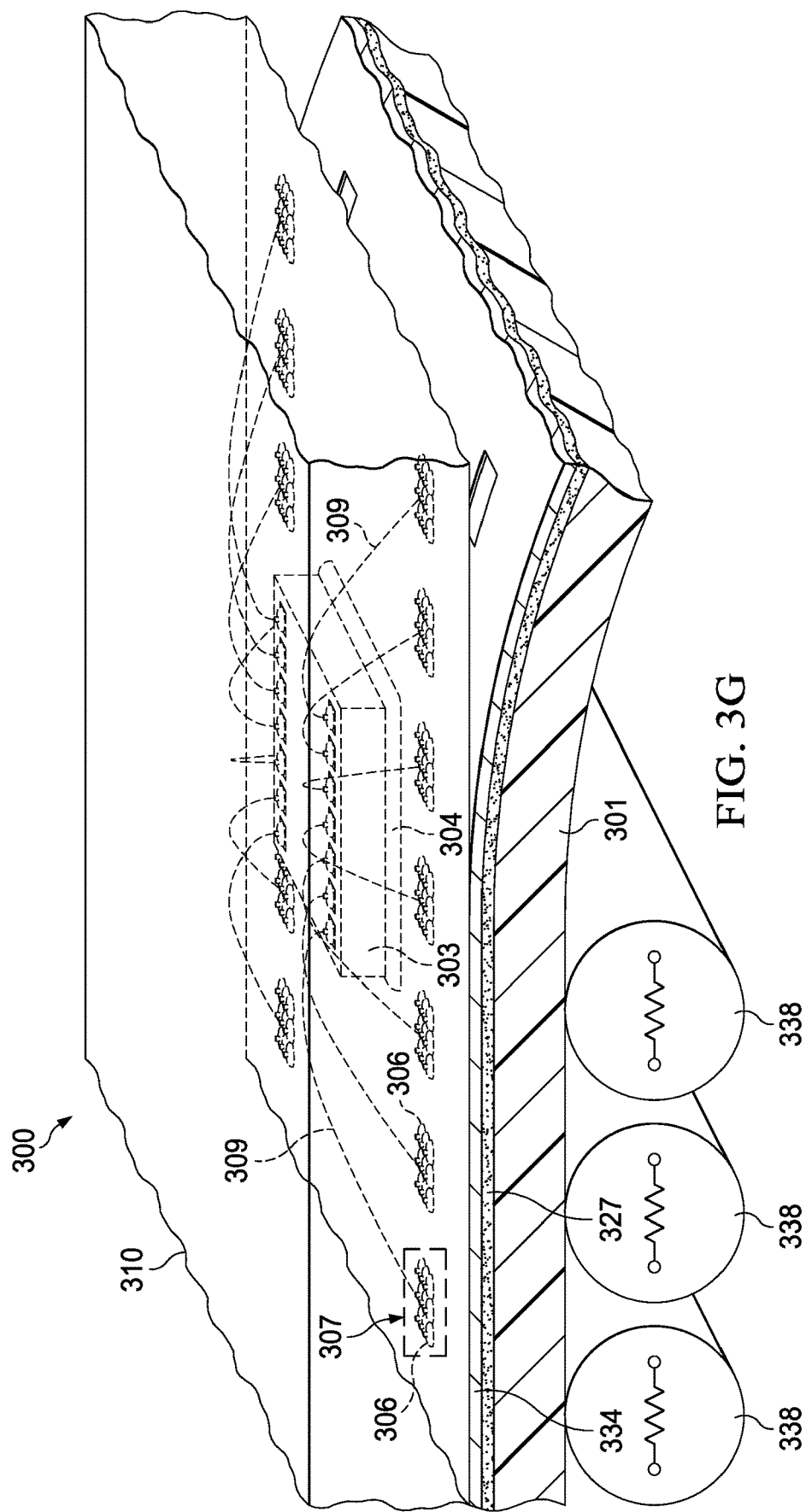

Referring to FIG. 3G, the carrier 301 and the releasable adhesive 327 are removed from the microelectronic device 300. Portions of the pad metal layer 334 contacting the wire bond studs 306 remain attached to the wire bond studs 306 to form parts of the intermediate pads 307. In versions of this example in which the releasable adhesive 327 is implemented with a thermolabile material, removal of the carrier 301 and the releasable adhesive 327 may be performed by heating the releasable adhesive 327 to a temperature sufficient to weaken adhesion of the releasable adhesive 327 to the pad metal layer 334. The pad separation features 335 disclosed in reference to FIG. 3D may facilitate separation of the portions of the pad metal layer 334 contacting the wire bond studs 306 from a remainder of the pad metal layer 334. In this example, the releasable adhesive 327 may be weakened by heating the releasable adhesive 327 with heated rollers 338. Other methods of heating the releasable adhesive 327, such as a hotplate process or a radiative heating process, are within the scope of this example.

Figure 3H:
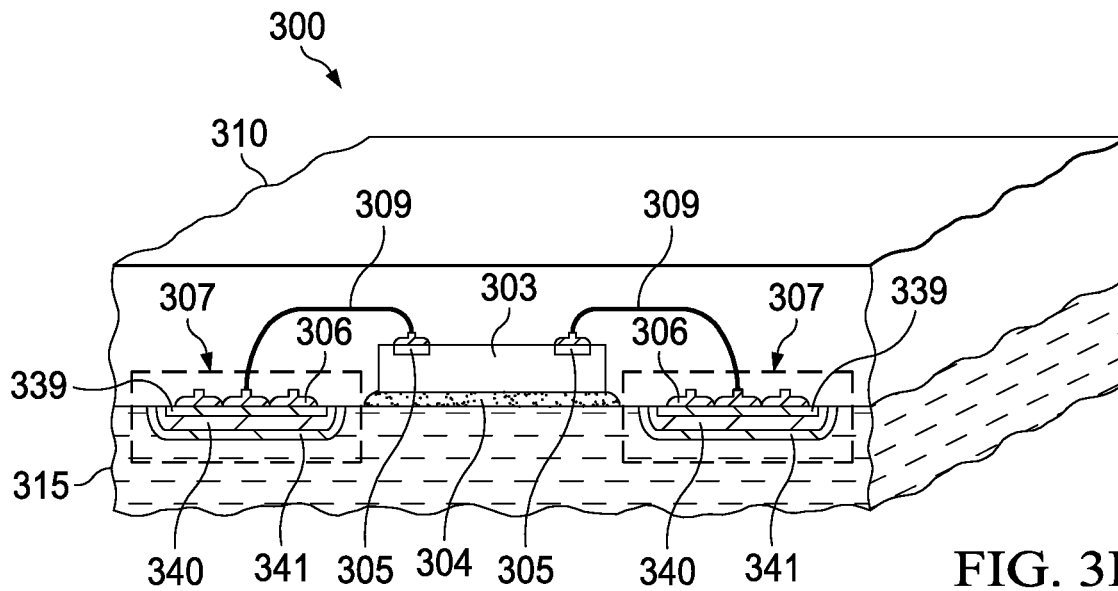

FIG. 3H is a cross section of the microelectronic device 300 after the carrier 301 and the releasable adhesive 327 of FIG. 3G have been removed. The portions of the pad metal layer 334 of FIG. 3G remaining attached to the wire bond studs 306 provide supplementary metal pads 339 of the intermediate pads 307.

One or more metal layers are formed on the supplementary metal pads 339. The one or more metal layers may include a base layer 340 on the supplementary metal pads 339, and a barrier layer 341 on the base layer 340. The base layer 340 may include copper or copper alloy, and may be formed to have a thickness of 50 microns to 150 microns, to provide a low resistance for the intermediate pads 307. The barrier layer 341 may include one or more metals that reduce diffusion between metal, such as copper, in the base layer 340 and subsequently-attached inner gull-wing leads 322a and outer gull-wing leads 322b, shown in FIG. 3J. Referring back to FIG. 3H, the barrier layer 341 may include, for example, nickel, palladium, cobalt, titanium, or molybdenum, and may be formed to have a thickness of 5 microns to 20 microns, for example.

The base layer 340 and the barrier layer 341, may be formed by a plating process, using a plating bath 315. The chemistry of the plating bath 315 may be changed to provide desired compositions of the base layer 340 and the barrier layer 341. The plating process may be implemented as an autocatalytic electroless process or an immersion process, for example, and may be implemented as separate plating baths. The base layer 340 and the barrier layer 341 may be characterized by a conformal configuration on the supplementary metal pads 339, in which the base layer 340 and the barrier layer 341 conform to contours of the supplementary metal pads 339, resulting from the plating process. The wire bond studs 306, the supplementary metal pads 339, the base layer 340, and the barrier layer 341 are parts of the intermediate pads 307 in this example.

Figure 3I:
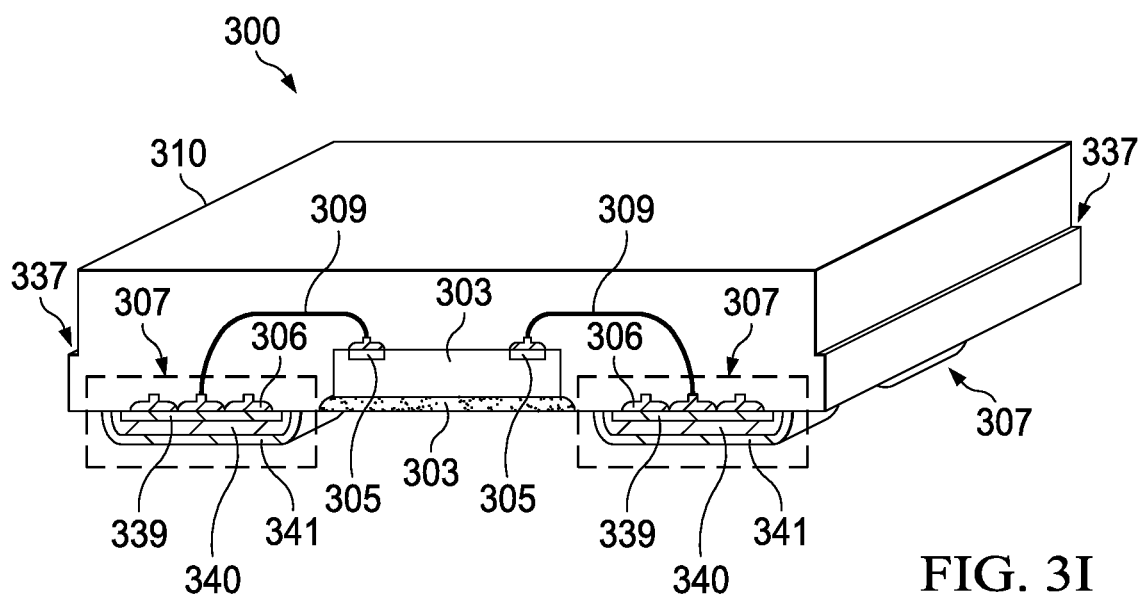

Referring to FIG. 3I, the microelectronic device 300 is singulated from the additional microelectronic devices 300a of FIG. 3F, by severing through the encapsulation material 310 below the singulation trenches 337 between the microelectronic device 300 and the additional microelectronic devices 300a. The microelectronic device 300 may be singulated by stressing the encapsulation material 310 below the singulation trenches 337 using singulation tape and a breaking dome, for example. Alternatively, the microelectronic device 300 may be singulated by a laser ablation process, a saw process, or a water jet process. Singulating the microelectronic device 300 may be facilitated by the absence of metal in the encapsulation material 310 below the singulation trenches 337.

Figure 3J:
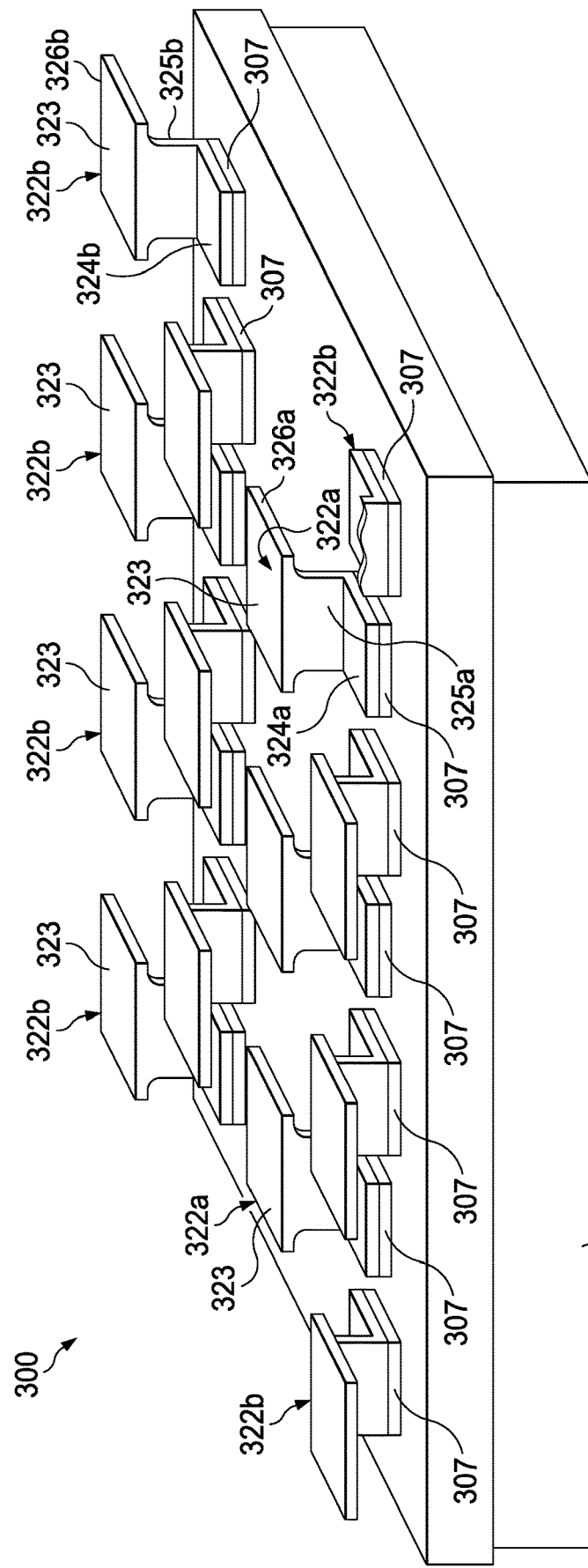

Referring to FIG. 3J, inner gull-wing leads 322a and outer gull-wing leads 322b are attached to the intermediate pads 307. Each of the inner gull-wing leads 322a and the outer gull-wing leads 322b has an external attachment surface 323. The inner gull-wing leads 322a and the outer gull-wing leads 322b may be attached to a lead frame, not shown in FIG. 3J, while being attached to the intermediate pads 307. Alternatively, the inner gull-wing leads 322a and the outer gull-wing leads 322b may be separated from a lead frame and from each other before being attached to the intermediate pads 307. The inner gull-wing leads 322a and the outer gull-wing leads 322b may be preformed into gull-wing shapes before being attached to the intermediate pads 307.

The inner gull-wing leads 322a and the outer gull-wing leads 322b may include, for example, stainless steel, or copper clad with stainless steel, to provide a desired balance between mechanical strength and electrical resistance. The inner gull-wing leads 322a and the outer gull-wing leads 322b do not require surface features to provide adhesion to mold compounds, such as roughened surface areas or etched contours, commonly used to promote adhesion to mold compounds. Thus, the inner gull-wing leads 322a and the outer gull-wing leads 322b may be formed by stamping, which may reduce a fabrication cost for the microelectronic device 300. Other materials for the inner gull-wing leads 322a and the outer gull-wing leads 322b and methods of forming the inner gull-wing leads 322a and the outer gull-wing leads 322b are within the scope of this example. The inner gull-wing leads 322a and the outer gull-wing leads 322b may be attached to the intermediate pads 307 by a microwelding process, by a solder process, by using an electrically conductive adhesive, or by another method.

Each of the inner gull-wing leads 322a has a first portion 324a which contacts the corresponding intermediate pad 307, a second portion 325a continuous with the first portion 324a and extending away from the intermediate pad 307, and a third portion 326a continuous with the second portion 325a, opposite from the first portion 324a. The third portion 326a includes the external attachment surface 323. The first portion 324a extends laterally in a first direction from a boundary with the second portion 325a. In this case, the term "laterally" refers to a direction parallel to a surface of the encapsulation material 310 containing the intermediate pads 307. The third portion 326a extends laterally in a second direction, opposite from the first direction, from a boundary with the second portion 325a. The third portion 326a is not coplanar with the first portion 324a, being offset by the second portion 325a.

Similarly, each of the outer gull-wing leads 322b has a first portion 324b which contacts the corresponding intermediate pad 307, a second portion 325b continuous with the first portion 324b and extending away from the intermediate pad 307, and a third portion 326b continuous with the second portion 325b, opposite from the first portion 324b. The first portion 324b, the second portion 325b, and the third portion 326b of each of the outer gull-wing leads 322b has the same spatial relationships with respect to the surface of the encapsulation material 310 containing the intermediate pads 307 and to each other as the first portion 324a, the second portion 325a, and the third portion 326a of each of the inner gull-wing leads 322a.

Figure 3K:
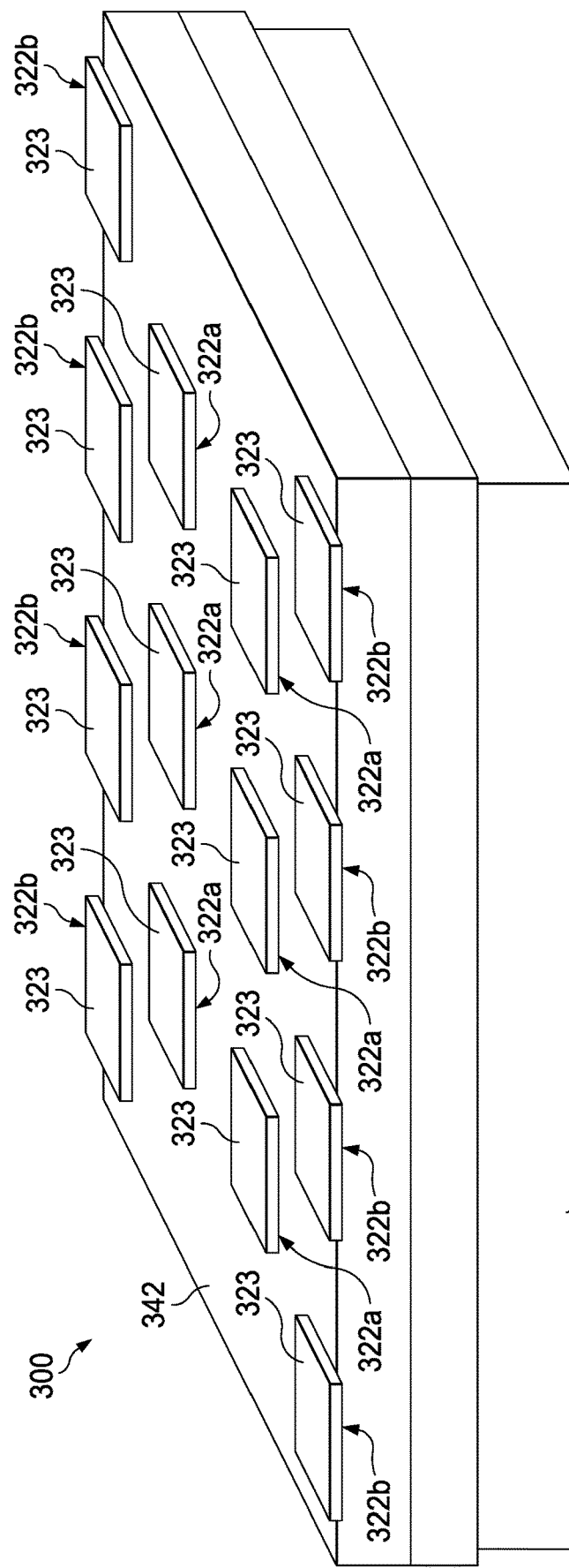

Referring to FIG. 3K, a permanent dielectric layer 342 is formed on the encapsulation material 310, exposing the external attachment surfaces 323. The permanent dielectric layer 342 may include, for example, epoxy, polyimide, silicone polymer, or inorganic dielectric material such as ceramic. The permanent dielectric layer 342 may be formed, for example, using a screen printing process or an additive process, such as a material jetting process or a material extrusion process. The permanent dielectric layer 342 may advantageously provide mechanical support for the inner gull-wing leads 322a and the outer gull-wing leads 322b.

The external attachment surfaces 323 of the outer gull-wing leads 322b are located outside of the external attachment surfaces 323 of the inner gull-wing leads 322a, that is, the external attachment surface 323 of each outer gull-wing lead 322b is located farther from a center of the die 303 of FIG. 3I than the external attachment surface 323 of an inner gull-wing lead 322a located adjacent to the outer gull-wing lead 322b, providing a multirow gull-wing configuration. The multirow gull-wing configuration may advantageously enable locating the external attachment surfaces 323 in a smaller area than a comparable device having a single row configuration, while maintaining benefits of the gull-wing lead shape.

Figure 4C:
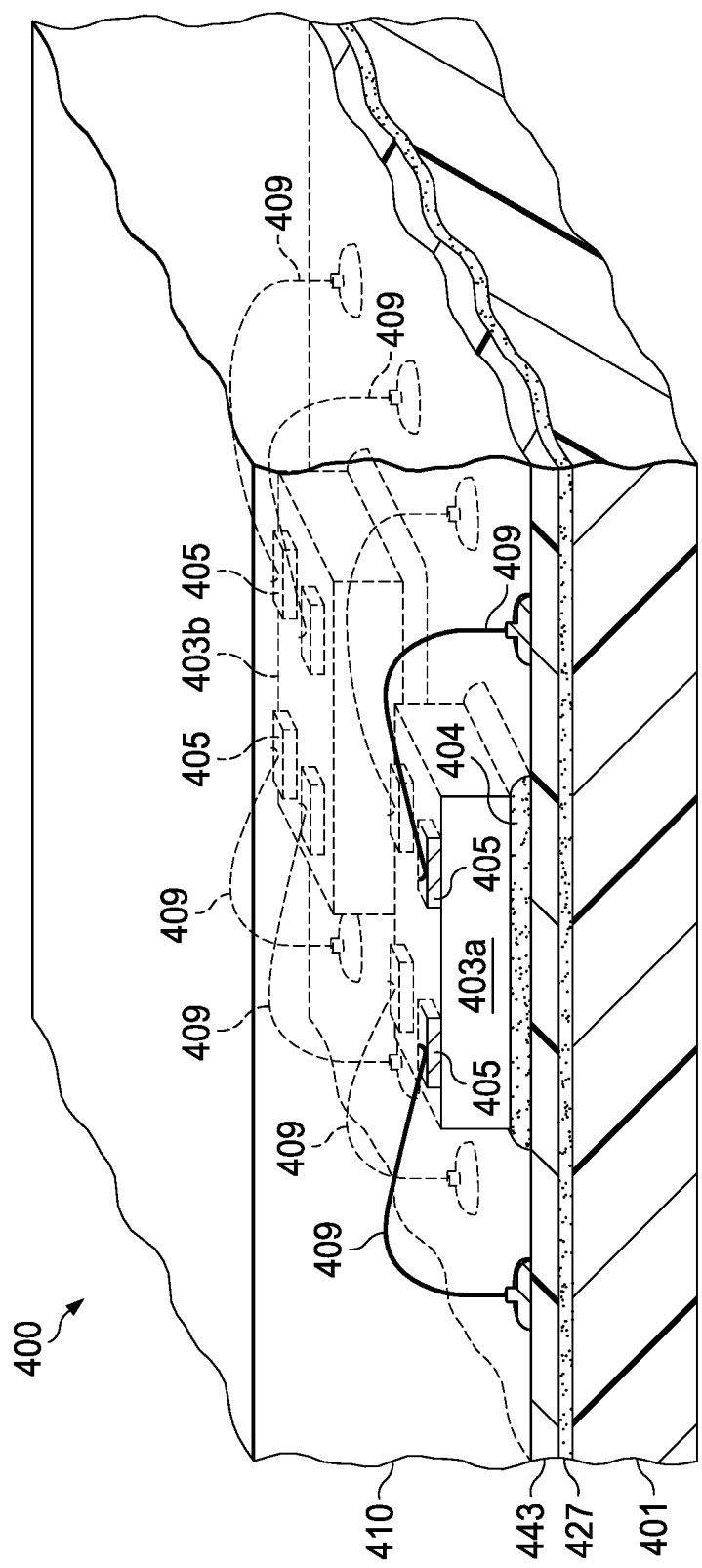

FIG. 4A through FIG. 4I include various views of a microelectronic device having a multirow gull-wing chip scale package, depicted in stages of a further example method of formation. Referring to FIG. 4A, formation of the microelectronic device 400 begins by providing a carrier 401. In this example, the carrier 401 may be flexible, to facilitate subsequent removal of the carrier 401. The carrier 401 may include, for example, polyethylene, polypropylene, nylon, or polyurethane. The carrier 401 may have a laminated structure, or a fiber-reinforced structure, to provide a desired mechanical strength. Other compositions and structures for the carrier 401 are within the scope of this example. The carrier 401 has an area for the microelectronic device 400, and areas for additional microelectronic devices 400a. The carrier 401 may have alignment marks, not shown in FIG. 4A, to assist subsequent placement of die on the carrier 401.

A releasable adhesive 427 is disposed on the carrier 401. A sacrificial layer 443 is disposed on the releasable adhesive 427. The sacrificial layer 443 includes one or more materials having a hardness suitable for forming ribbon stitch bonds or wire bond studs. The sacrificial layer 443 includes materials which can be removed from the microelectronic device 400 without degrading the microelectronic device 400, for example by a wet etch process. The sacrificial layer 443 may include, for example, aluminum oxide, aluminum nitride, polycrystalline silicon, hydrogen-rich silicon nitride, or phosphosilicate glass (PSG). The sacrificial layer 443 may be 1 micron to 10 microns thick, to facilitate removal from the microelectronic device 400. The releasable adhesive 427 may include, for example, a microsuction tape which has microscopic pores on a face of the releasable adhesive 427 contacting the sacrificial layer 443. The microsuction tape may be permanently affixed to the carrier 401, for example by a permanent adhesive. The microsuction tape may be separated from the sacrificial layer 443 by peeling the carrier 401 from the sacrificial layer 443, advantageously leaving no residue on the sacrificial layer 443. Alternatively, the releasable adhesive 427 may include a silicone layer which exhibits high adhesion to the sacrificial layer 443 in a shear mode, but is easily removed by a peeling process. Other implementations of the releasable adhesive 427 may include a non-permanent adhesive material, a thermolabile material, or a photolabile material.

In this example, a first die 403a and a second die 403b are attached to the sacrificial layer 443 in an area for the microelectronic device 400. Additional instances of the first die 403a and the second die 403b may be attached to the sacrificial layer 443 in separate areas for additional microelectronic devices 400a, as depicted in FIG. 4A. Either of the first die 403a and the second die 403b may be manifested as an integrated circuit, a discrete semiconductor component, an electro-optical device, a MEMS device, or other microelectronic die. The first die 403a and the second die 403b may be separate types of devices.

FIG. 4B shows the microelectronic device 400 in more detail. In this example, the first die 403a and the second die 403b may be attached to the sacrificial layer 443 by a die attach material 404, or by another material or method. In this example, the die attach material 404 may be electrically non-conductive, to isolate the first die 403a and the second die 403b. The die attach material 404 may be implemented as an adhesive such as epoxy, to provide a desired level of electrical isolation. The first die 403a and the second die 403b may have terminals 405 for electrical connections to components in the first die 403a and the second die 403b. The terminals 405 may be manifested as bond pads, or circuit nodes. The terminals 405 may include materials suitable for wire bonding.

Wire bonds 409 are formed from the first die 403a and the second die 403b to the sacrificial layer 443. The wire bonds 409 may be formed to have ball bonds on the sacrificial layer 443 and stitch bonds on the terminals 405, as indicated in FIG. 4B. In one variation of this example, the wire bonds 409 may be formed to have ball bonds on the terminals 405 and stitch bonds on the sacrificial layer 443. In another variation, wire bond studs may be formed on the sacrificial layer 443, and the wire bonds 409 may be formed to have ball bonds on the terminals 405 and stitch bonds on the wire bond studs. Other variations for the wire bonds 409 are within the scope of this example. The sacrificial layer 443 may provide a sufficiently hard surface to form ball bond terminations, stitch bond terminations, or wire bond stud terminations of the wire bonds 409. Additional wire bonds, not shown in FIG. 4B, may directly connect the first die 403a and the second die 403b.

Referring to FIG. 4C, an encapsulation material 410 is formed over the first die 403a and the second die 403b, and the wire bonds 409. The encapsulation material 410 extends to the sacrificial layer 443 adjacent to the first die 403a and the second die 403b, and the wire bonds 409. The encapsulation material 410 may include epoxy or other material suitable for protecting the first die 403a and the second die 403b, and the wire bonds 409 from moisture and contamination. The encapsulation material 410 may be formed by an injection mold process, an additive process such as a material extrusion process, a spray process, or another method.

Figure 4D:
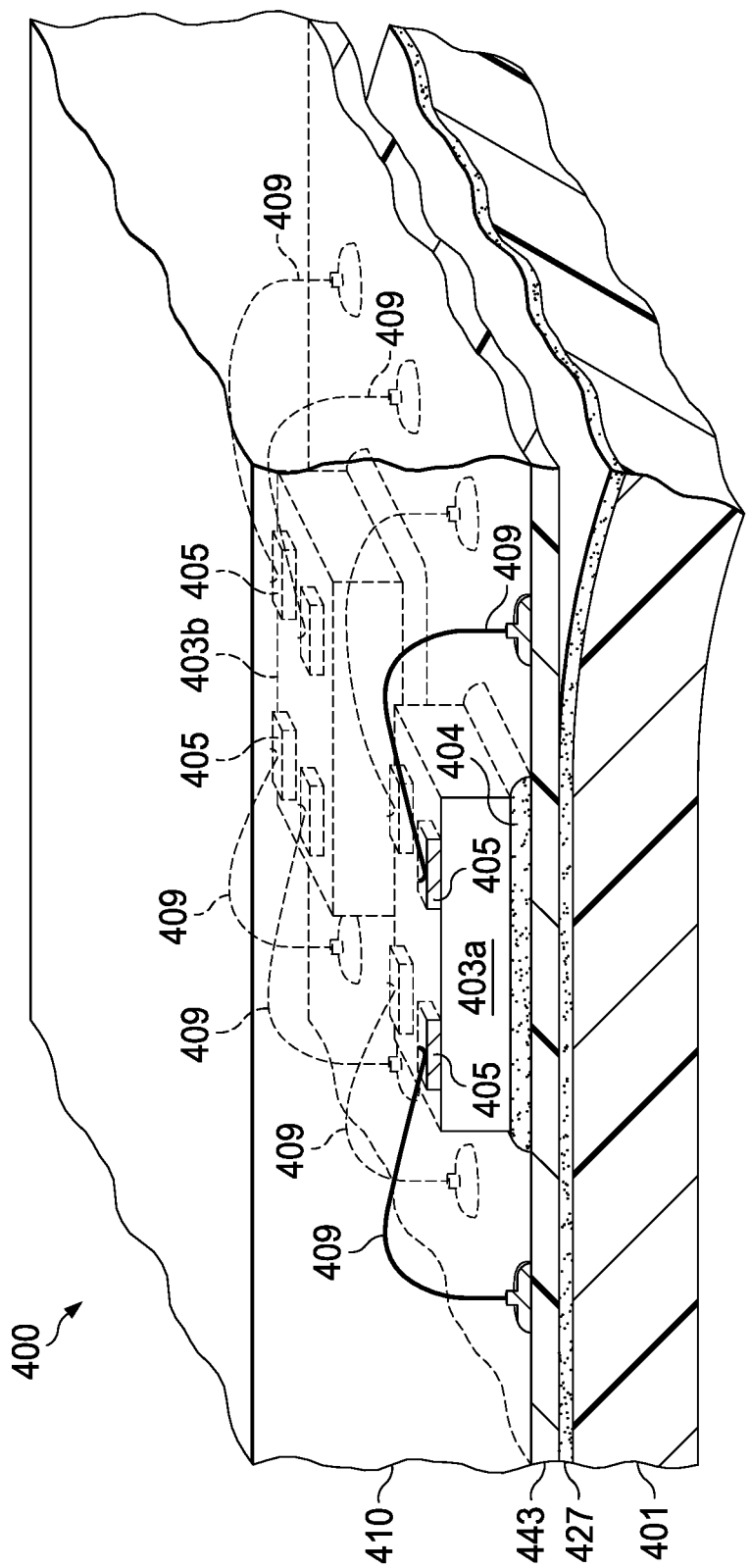

Referring to FIG. 4D, the carrier 401 and the releasable adhesive 427 are removed from the microelectronic device 400, leaving the sacrificial layer 443 attached to the microelectronic device 400. In versions of this example in which the releasable adhesive 427 is implemented having the microsuction tape or the silicone layer, described in reference to FIG. 4A, the carrier 401 and the releasable adhesive 427 may be removed by a peeling process, as indicated in FIG. 4D. In versions of this example in which the releasable adhesive 427 is implemented with photolabile material or thermolabile material, the releasable adhesive 427 may be weakened, for example by exposure to UV radiation or by heating, as appropriate, to facilitate removal of the carrier 401.

Figure 4E:
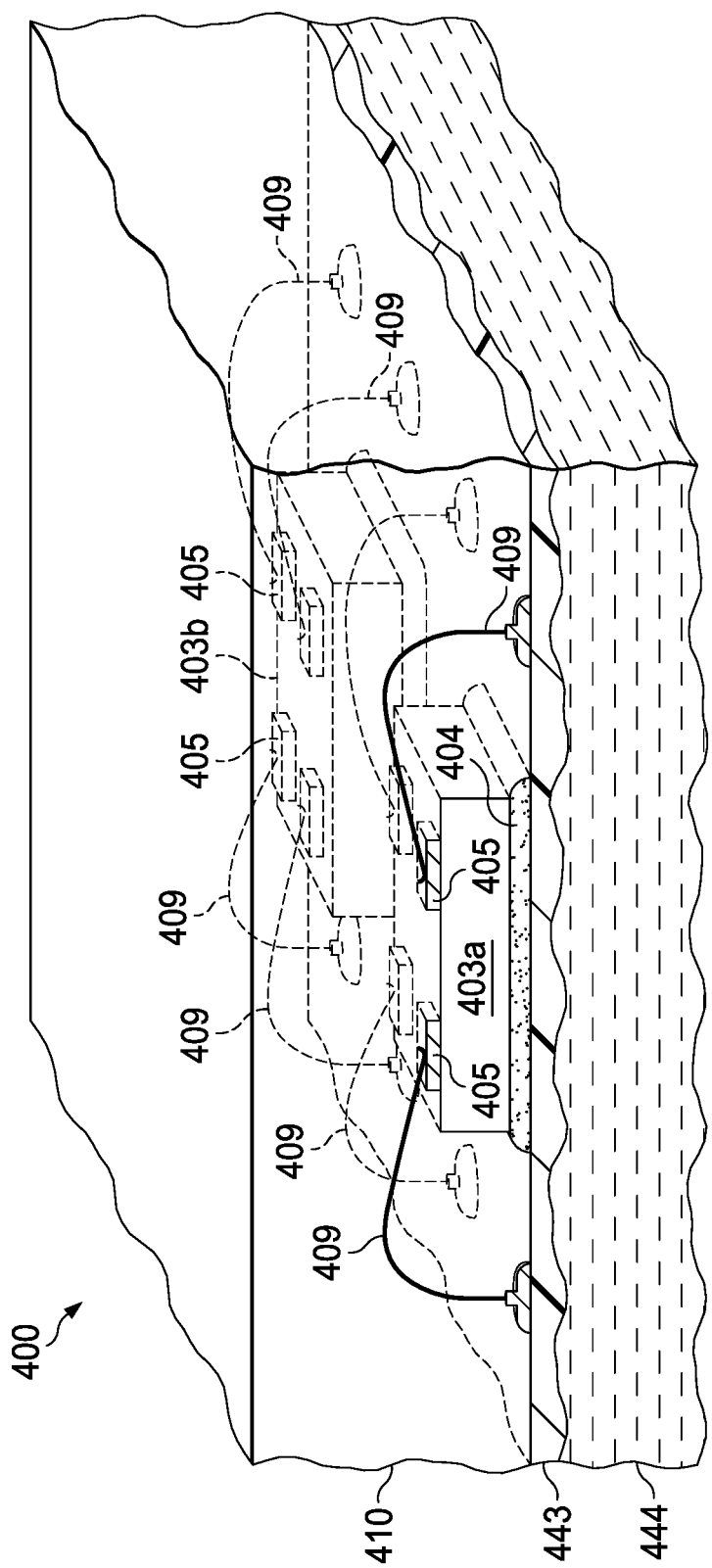

Referring to FIG. 4E, the sacrificial layer 443 is removed from the microelectronic device 400, exposing terminations of the wire bonds 409. The sacrificial layer 443 may be removed using a wet etch bath 444 which etches the sacrificial layer 443 without significantly degrading the terminations of the wire bonds 409. For example, the wet etch bath 444 may include an aqueous solution of potassium hydroxide, tetramethylammonium hydroxide, or choline hydroxide, which may remove aluminum oxide, aluminum nitride, polycrystalline silicon, hydrogen-rich silicon nitride, or PSG in the sacrificial layer 443 without significantly degrading copper or gold in the wire bonds 409. FIG. 4E depicts removal of the sacrificial layer 443 partway to completion.

Figure 4F:
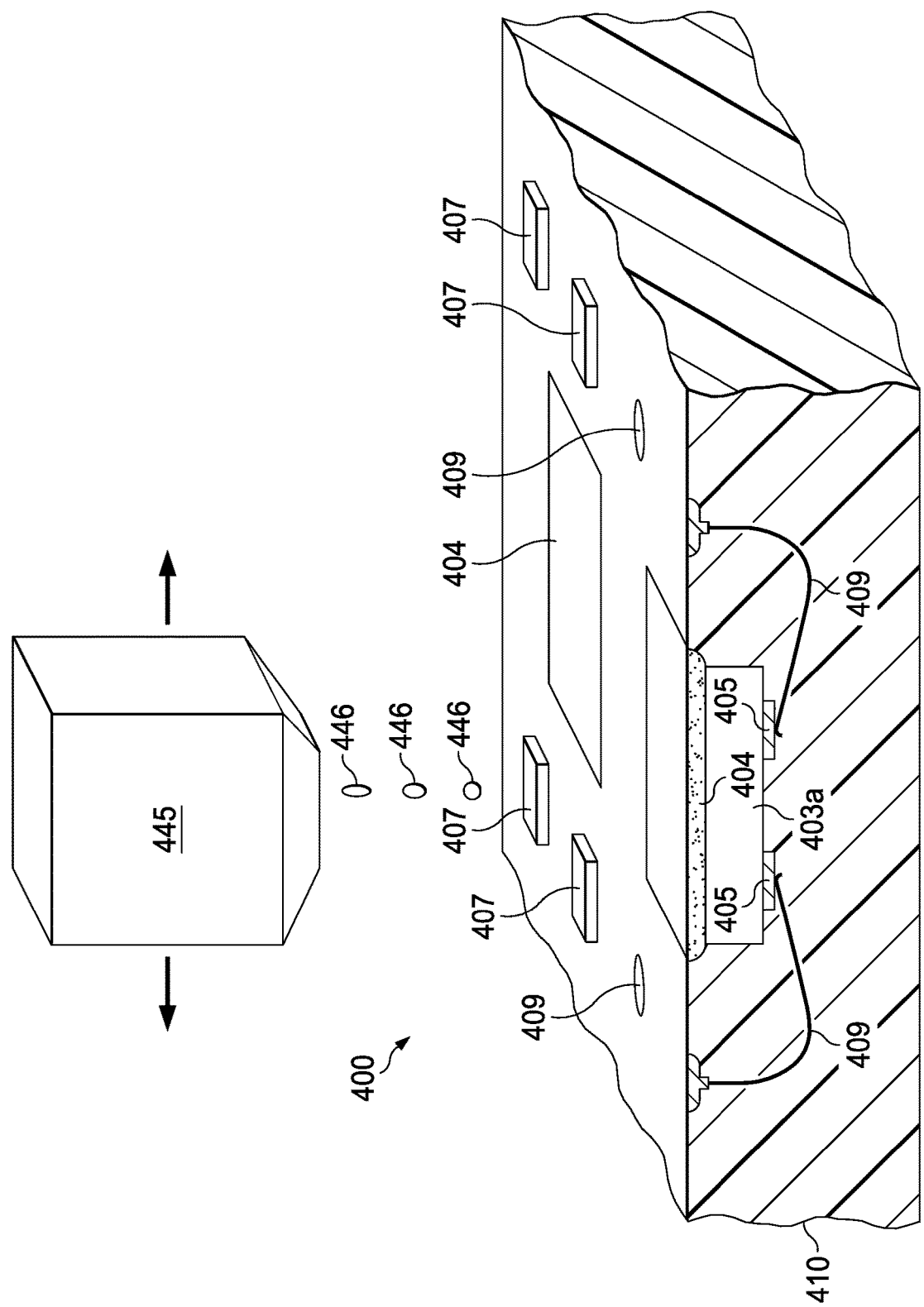

Referring to FIG. 4F, intermediate pads 407 are formed on the encapsulation material 410, contacting the wire bonds 409. The encapsulation material 410 contacts the intermediate pads 407. The intermediate pads 407 are electrically conductive, and have sufficient sizes to provide reliable connections to subsequently-attached inner gull-wing leads 422a and outer gull-wing leads 422b, shown in FIG. 4G. The intermediate pads 407 may be formed by an additive process such as a material jetting process using a material jetting apparatus 445 which dispenses a conductor ink 446 that includes electrically conductive material such as metal particles, graphene flakes, carbon nanotubes, or mxene flakes of metal carbides or metal nitrides. Other methods of forming the intermediate pads 407, such as using a screen printing process, attaching preformed metal pads to the wire bonds 409 by a thermo-sonic bonding process, or using a metal plasma spray through a shadow mask, are within the scope of this example.

Figure 4G:
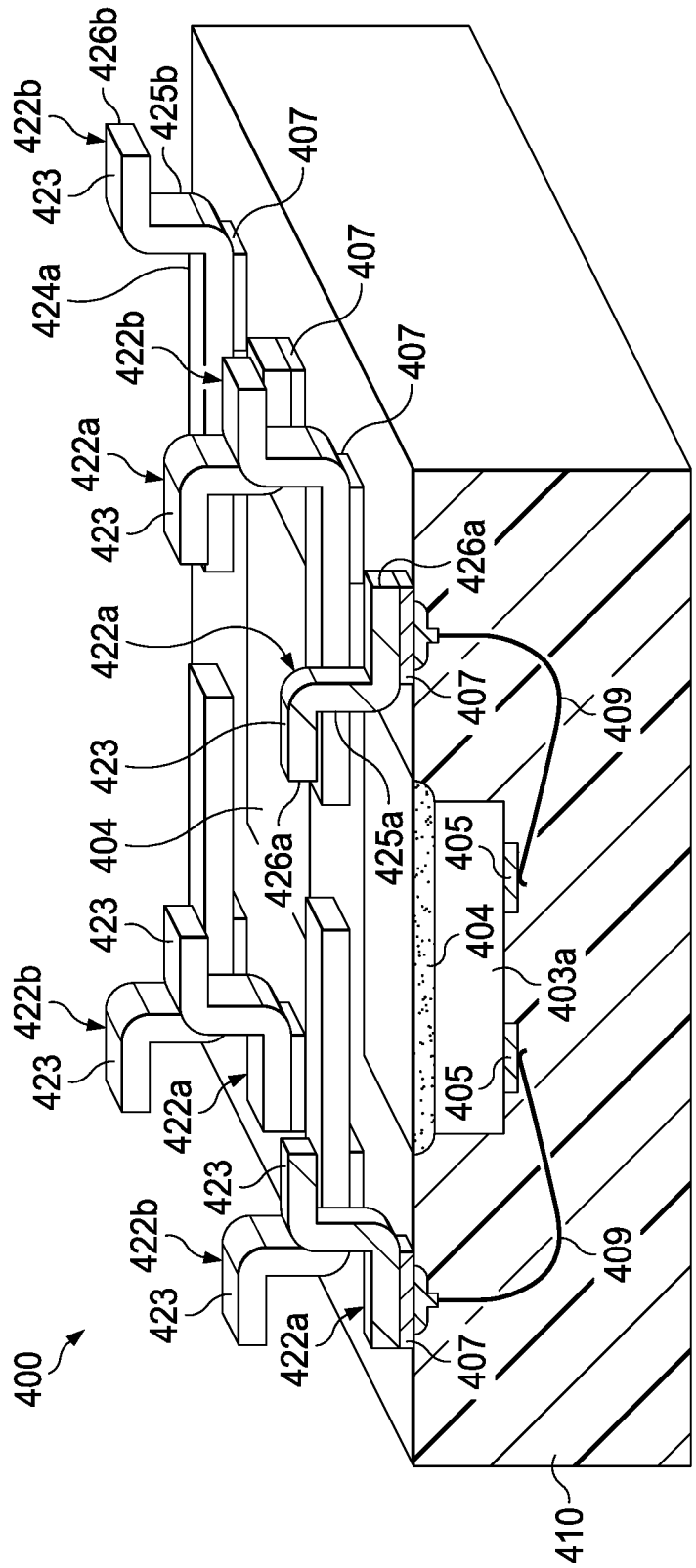

Referring to FIG. 4G, the microelectronic device 400 is singulated to separate the microelectronic device 400 from the additional microelectronic devices 400a of FIG. 4A. The microelectronic device 400 may be singulated using a saw process, a laser ablation process, or other method. Singulation may be facilitated by an absence of metal in the encapsulation material 410 between the microelectronic device 400 and the adjacent additional microelectronic devices 400a.

Inner gull-wing leads 422a and outer gull-wing leads 422b are attached to the intermediate pads 407. Each of the with inner gull-wing leads 422a and the outer gull-wing leads 422b has an external attachment surface 423. The inner gull-wing leads 422a and the outer gull-wing leads 422b may be attached to a lead frame, not shown in FIG. 4G, while being attached to the intermediate pads 407. Alternatively, the inner gull-wing leads 422a and the outer gull-wing leads 422b may be separated from a lead frame and from each other before being attached to the intermediate pads 407. The inner gull-wing leads 422a and the outer gull-wing leads 422b may be preformed into gull-wing shapes before being attached to the intermediate pads 407.

The inner gull-wing leads 422a and the outer gull-wing leads 422b may include, for example, stainless steel, or copper clad with stainless steel, to provide a desired balance between mechanical strength and electrical resistance. The inner gull-wing leads 422a and the outer gull-wing leads 422b do not require surface features to provide adhesion to mold compounds, such as roughened surface areas or etched contours, commonly used to promote adhesion to mold compounds. Thus, the inner gull-wing leads 422a and the outer gull-wing leads 422b may be formed by stamping, which may reduce a fabrication cost for the microelectronic device 400. Other materials for the inner gull-wing leads 422a and the outer gull-wing leads 422b and methods of forming the inner gull-wing leads 422a and the outer gull-wing leads 422b are within the scope of this example. The inner gull-wing leads 422a and the outer gull-wing leads 422b may be attached to the intermediate pads 407 by a microwelding process, by a solder process, by using an electrically conductive adhesive, or by another method.

Each of the inner gull-wing leads 422a has a first portion 424a which contacts the corresponding intermediate pad 407, a second portion 425a continuous with the first portion 424a and extending away from the intermediate pad 407, and a third portion 426a continuous with the second portion 425a, opposite from the first portion 424a. The third portion 426a includes the external attachment surface 423. The first portion 424a extends laterally in a first direction from a boundary with the second portion 425a. In this case, the term "laterally" refers to a direction parallel to a surface of the encapsulation material 410 containing the intermediate pads 407. The third portion 426a extends laterally in a second direction, opposite from the first direction, from a boundary with the second portion 425a. The third portion 426a is not coplanar with the first portion 424a, being offset by the second portion 425a.

Similarly, each of the outer gull-wing leads 422b has a first portion 424b which contacts the corresponding intermediate pad 407, a second portion 425b continuous with the first portion 424b and extending away from the intermediate pad 407, and a third portion 426b continuous with the second portion 425b, opposite from the first portion 424b. The first portion 424b, the second portion 425b, and the third portion 426b of each of the outer gull-wing leads 422b has the same spatial relationships with respect to the surface of the encapsulation material 410 containing the intermediate pads 407 and to each other as the first portion 424a, the second portion 425a, and the third portion 426a of each of the inner gull-wing leads 422a. One or more of the outer gull-wing leads 422b may extend toward a center of the microelectronic device 400 to accommodate an external component 448, shown in FIG. 4I.

Figure 4H:
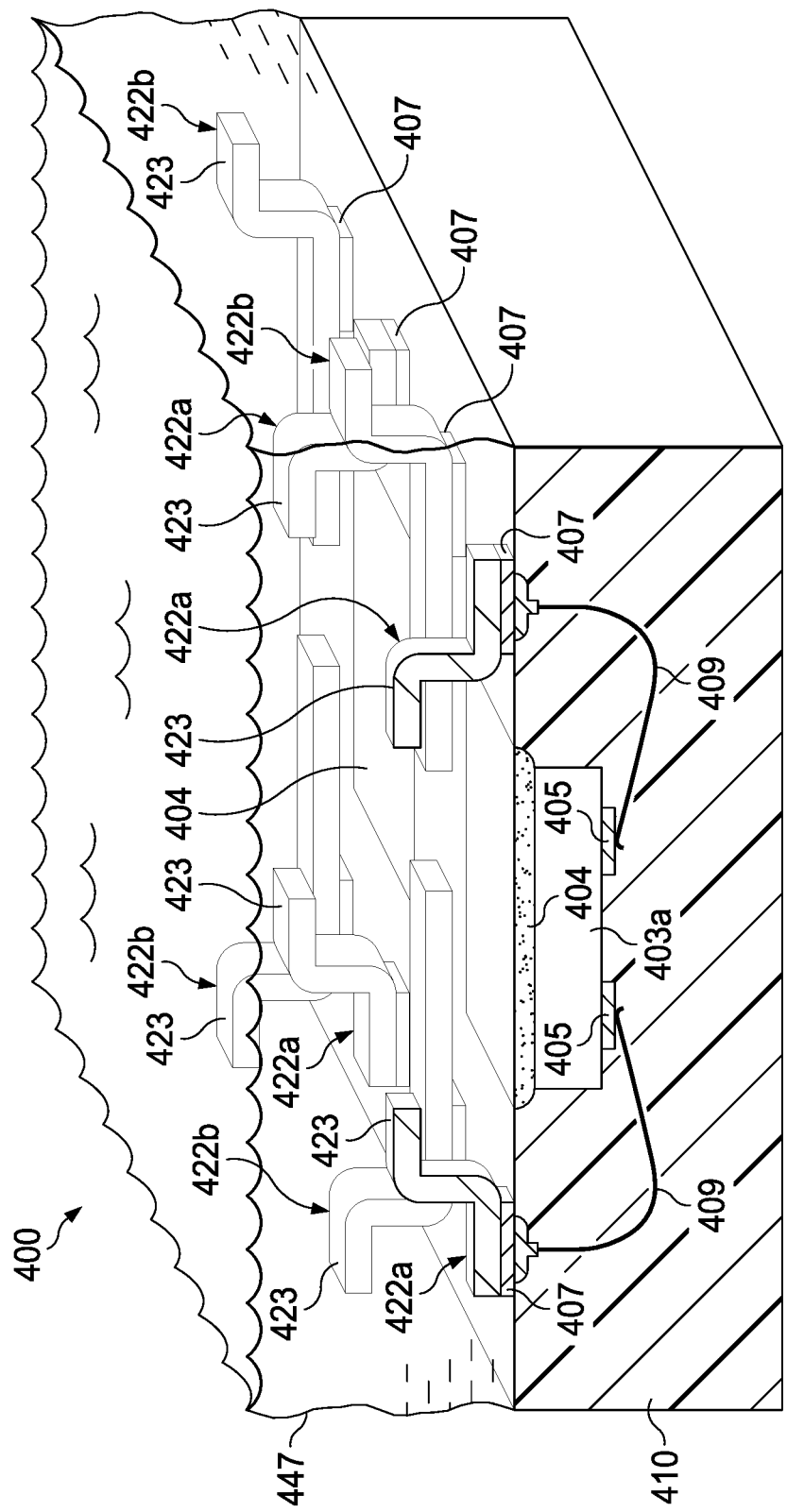

Referring to FIG. 4H, the inner gull-wing leads 422a and the outer gull-wing leads 422b are plated with one or more plated metal layers using a plating bath 447. The one or more plated metals may include, for example, nickel, to provide protection of the inner gull-wing leads 422a and the outer gull-wing leads 422b from oxidation or corrosion. The one or more plated metals may include, for example, zinc, to improve solderability of the external attachment surfaces 423. Other metals may be plated on the inner gull-wing leads 422a and the outer gull-wing leads 422b. The plating bath 447 may be implemented to perform an autocatalytic electroless process or an immersion process.

Figure 4I:
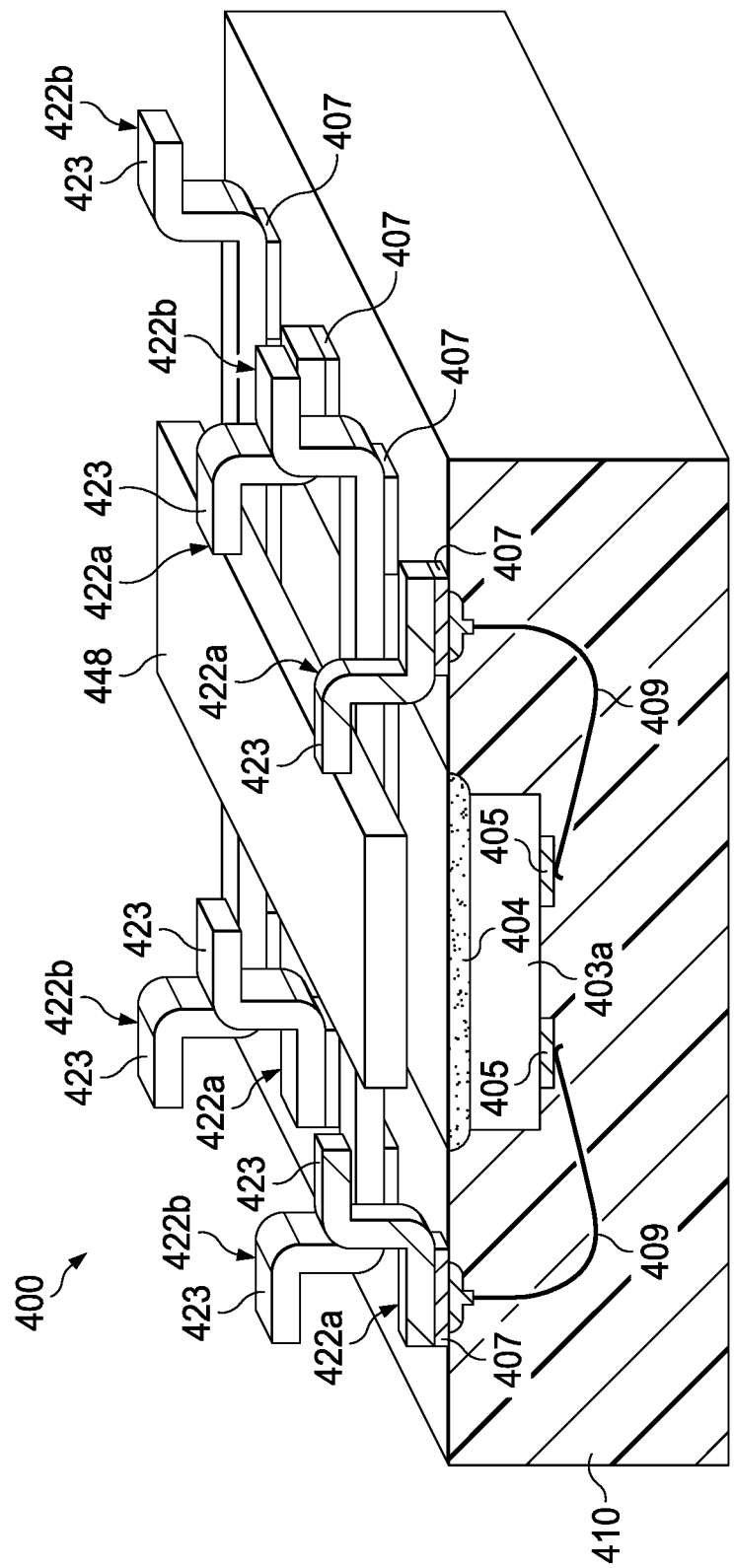

Referring to FIG. 4I, the external component 448 is attached to one or more of the outer gull-wing leads 422b. The external component 448 may be implemented as any of an integrated circuit, a discrete semiconductor component, an electro-optical device, a MEMS device, or a passive component, such as a resistor, a capacitor, an inductor, or a filter. The external component 448 may be attached to the outer gull-wing leads 422b by a solder, an electrically conductive adhesive, or an anisotropic conductive tape, for example. In this example, the external component 448 is part of the microelectronic device 400. FIG. 4I shows the completed microelectronic device 400. The external attachment surfaces 423 of the outer gull-wing leads 422b are located outside of the external attachment surfaces 423 of the inner gull-wing leads 422a, that is, the external attachment surface 423 of each outer gull-wing lead 422b is located farther from a center of the first die 403a than the external attachment surface 423 of an inner gull-wing lead 422a located adjacent to the outer gull-wing lead 422b, providing a multirow gull-wing configuration. The multirow gull-wing configuration may advantageously enable locating the external attachment surfaces 423 in a smaller area than a comparable device having a single row configuration, while maintaining benefits of the gull-wing lead shape.

Having the external component 448 attached to the outer gull-wing leads 422b may reduce an area of the microelectronic device 400, advantageously enabling a smaller form factor for a product using the microelectronic device 400. Having the external component 448 attached to the outer gull-wing leads 422b may provide lower resistance connections between the external component 448 and the first die 403a or the second die 403b, compared to locating the external device on a circuit substrate adjacent to the first die 403a or the second die 403b. The second die 403b is obscured in FIG. 4I by the encapsulation material 410, the inner gull-wing leads 422a, and the outer gull-wing leads 422b.

Figure 5A:
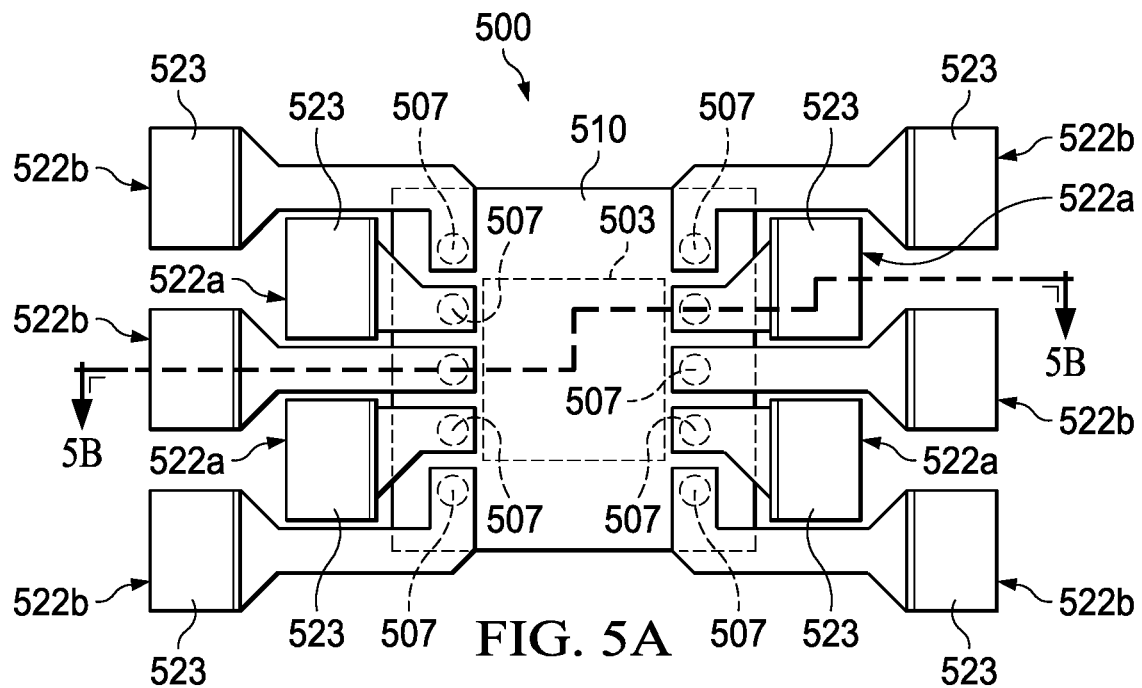
FIG. 5A and FIG. 5B are a plan view and a cross section, respectively, of an example microelectronic device having a multirow gull-wing chip scale package.
Figure 5B:
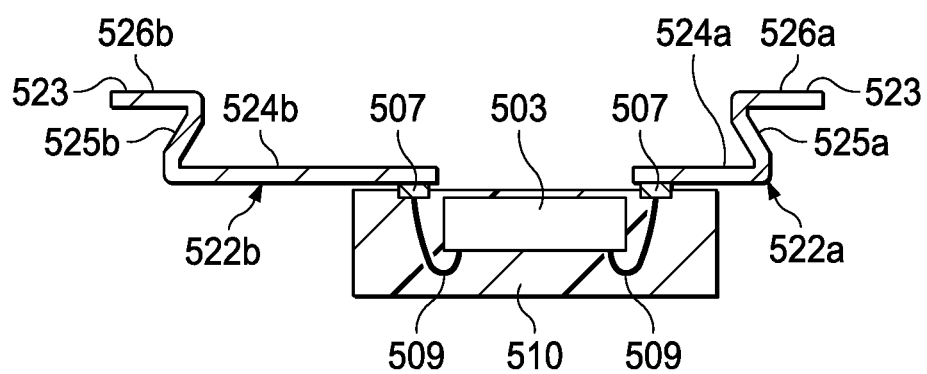

FIG. 5A and FIG. 5B are a plan view and a cross section, respectively, of an example microelectronic device having a multirow gull-wing chip scale package. The microelectronic device 500 has a die 503 surrounded by an encapsulation material 510. The microelectronic device 500 includes intermediate pads 507 which are electrically connected to the die 503 through wire bonds 509. Inner gull-wing leads 522a and outer gull-wing leads 522b are electrically connected to the intermediate pads 507. The inner gull-wing leads 522a and the outer gull-wing leads 522b are located outside of the encapsulation material 510. Each of the inner gull-wing leads 522a and the outer gull-wing leads 522b has an external attachment surface 523.

Each of the inner gull-wing leads 522a has a first portion 524a which contacts the corresponding intermediate pad 507, a second portion 525a continuous with the first portion 524a and extending away from the intermediate pad 507, and a third portion 526a continuous with the second portion 525a, opposite from the first portion 524a. The third portion 526a includes the external attachment surface 523. The first portion 524a extends laterally in a first direction from a boundary with the second portion 525a. In this case, the term "laterally" refers to a direction parallel to a surface of the encapsulation material 510 containing the intermediate pads 507. The third portion 526a extends laterally in a second direction, opposite from the first direction, from a boundary with the second portion 525a. The third portion 526a is not coplanar with the first portion 524a, being offset by the second portion 525a.

Similarly, each of the outer gull-wing leads 522b has a first portion 524b which contacts the corresponding intermediate pad 507, a second portion 525b continuous with the first portion 524b and extending away from the intermediate pad 507, and a third portion 526b continuous with the second portion 525b, opposite from the first portion 524b. The first portion 524b, the second portion 525b, and the third portion 526b of each of the outer gull-wing leads 522b has the same spatial relationships with respect to the surface of the encapsulation material 510 containing the intermediate pads 507 and to each other as the first portion 524a, the second portion 525a, and the third portion 526a of each of the inner gull-wing leads 522a.

The external attachment surfaces 523 of the outer gull-wing leads 522b are located outside of the external attachment surfaces 523 of the inner gull-wing leads 522a, that is, the external attachment surface 523 of each outer gull-wing lead 522b is located farther from a center of the die 503 than the external attachment surface 523 of an inner gull-wing lead 522a located adjacent to the outer gull-wing lead 522b, providing a multirow gull-wing configuration. The multirow gull-wing configuration may advantageously enable locating the external attachment surfaces 523 in a smaller area than a comparable device having a single row configuration, while maintaining benefits of the gull-wing lead shape.

In this example, the inner gull-wing leads 522a and the outer gull-wing leads 522b are both located on two opposite sides of the microelectronic device 500. The combined external attachment surfaces 523 extend past the encapsulation material 510 in all lateral directions, wherein the term "lateral" in this case refers to a direction parallel to a surface of the encapsulation material 510 containing the intermediate pads 507. Having the encapsulation material 510 smaller than the lateral extents of the external attachment surfaces 523 may advantageously enable lower fabrication costs of the die 503 and the encapsulation material 510 while conforming to a prescribed spatial configuration for the external attachment surfaces 523.

Various features of the examples disclosed herein may be combined in other manifestations of example microelectronic devices. For example, multiple die may be included in the example microelectronic devices disclosed in reference to FIG. 1A through FIG. 1K, FIG. 2A through FIG. 2J, and FIG. 3A through FIG. 3K, similar to the example disclosed in reference to FIG. 4A through FIG. 4I. Encapsulation material may be formed on the example microelectronic devices disclosed in the examples herein by any of the methods disclosed in reference to FIG. 1A through FIG. 1K, FIG. 2A through FIG. 2J, FIG. 3A through FIG. 3K, and FIG. 4A through FIG. 4I. Singulation may be performed by any of the methods disclosed in reference to FIG. 1A through FIG. 1K, FIG. 2A through FIG. 2J, and FIG. 3A through FIG. 3K. Device identification marks may be formed on the microelectronic devices at any stage of formation, and is not limited to specific steps disclosed in reference to FIG. 1A through FIG. 1K. Inner gull-wing leads and outer gull-wing leads may be formed on the example microelectronic devices disclosed in the examples herein by any of the methods disclosed in reference to FIG. 1A through FIG. 1K, FIG. 2A through FIG. 2J, FIG. 3A through FIG. 3K, and FIG. 4A through FIG. 4I. Elements of the example microelectronic devices described herein, such as the intermediate pads, the wire bonds, the encapsulation material, and particles in the encapsulation material, may be formed according to methods disclosed with regard to analogous elements in the following commonly assigned U.S. patent applications: U.S. patent application Ser. No. 16/225,106, filed concurrently with this application, U.S. patent application Ser. No. 16/225,135, filed concurrently with this application, and U.S. patent application Ser. No. 16/225,164, filed concurrently with this application. These commonly assigned U.S. patent applications are incorporated herein by reference but are not admitted to be prior art with respect to the present invention by their mention in this section.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:

1. A microelectronic device, comprising:
   a first die;
   intermediate pads, wherein the intermediate pads are free of photolithographically-defined structures;
   wire bonds connecting the first die to the intermediate pads;
   an encapsulation material surrounding the wire bonds, at least partially surrounding the first die and contacting the first die, and contacting the intermediate pads;
   inner gull-wing leads contacting the intermediate pads, wherein:
      the inner gull-wing leads are located outside of the encapsulation material;
      each of the inner gull-wing leads has a first portion directly contacting the corresponding intermediate pad, a second portion continuous with the first portion and extending away from the intermediate pad, and a third portion continuous with the second portion, opposite from the first portion;
      the third portion includes an external attachment surface;
      the first portion extends laterally in a first direction from a boundary with the second portion, wherein the first direction is parallel to a surface of the encapsulation material containing the intermediate pads;
      the third portion extends laterally in a second direction, opposite from the first direction, from a boundary with the second portion; and
      the third portion is not coplanar with the first portion, being offset by the second portion; and
   outer gull-wing leads contacting the intermediate pads, wherein:
      the outer gull-wing leads are located outside of the encapsulation material;
      each of the outer gull-wing leads has a first portion directly contacting the corresponding intermediate pad, a second portion continuous with the first portion and extending away from the intermediate pad, and a third portion continuous with the second portion, opposite from the first portion;
      the third portion includes an external attachment surface;
      the first portion extends laterally in a first direction from a boundary with the second portion, wherein the first direction is parallel to a surface of the encapsulation material containing the intermediate pads;
      the third portion extends laterally in a second direction, opposite from the first direction, from a boundary with the second portion, wherein the first direction is parallel to the surface of the encapsulation material containing the intermediate pads;
      the third portion is not coplanar with the first portion, being offset by the second portion; and
      external attachment surfaces of the outer gull-wing leads are located outside of the external attachment surfaces of the inner gull-wing leads, wherein the external attachment surface of each outer gull-wing lead is located farther from a center of the first die than the external attachment surface of an inner gull-wing lead located adjacent to the outer gull-wing lead, wherein each of the intermediate pads includes a plurality of ribbon stitch bond strips.

2. The microelectronic device of claim 1, wherein each of the intermediate pads includes a plurality of wire stud bonds.

3. The microelectronic device of claim 1, wherein each of the intermediate pads includes plated metal, wherein the plated metal conforms to contours of electrically conductive elements of the intermediate pads contacting the plated metal.

4. The microelectronic device of claim 1, wherein each of the intermediate pads includes a preformed metal pad.

5. The microelectronic device of claim 1, wherein each of the intermediate pads includes a supplementary metal pad, wherein the supplementary metal pad is continuous across the intermediate pad containing the supplementary metal pad.

6. The microelectronic device of claim 1, further including an external component attached to at least one of the inner gull-wing leads or at least one of the outer gull-wing leads, wherein the external component is located outside of the encapsulation material.

7. The microelectronic device of claim 1, wherein the inner gull-wing leads and the outer gull-wing leads are both located on two opposite sides of the microelectronic device.

8. The microelectronic device of claim 1, wherein the inner gull-wing leads and the outer gull-wing leads are both located on four sides of the microelectronic device.

9. The microelectronic device of claim 1, wherein the combined external attachment surfaces extend past the encapsulation material in all directions parallel to a surface of the encapsulation material containing the intermediate pads.

10. A microelectronic device, comprising:
a first die;
intermediate pads;
wire bonds connecting the first die to the intermediate pads;
an encapsulation material surrounding the wire bonds, at least partially surrounding the first die and contacting the first die, and contacting the intermediate pads;
inner gull-wing leads contacting the intermediate pads, wherein:
each of the inner gull-wing leads has a first portion directly contacting the corresponding intermediate pad, a second portion continuous with the first portion and extending away from the intermediate pad, and a third portion continuous with the second portion, opposite from the first portion;
the first portion extends laterally in a first direction from a boundary with the second portion, wherein the first direction is parallel to a surface of the encapsulation material containing the intermediate pads;
the third portion extends laterally in a second direction, opposite from the first direction, from a boundary with the second portion; and
the third portion is not coplanar with the first portion, being offset by the second portion; and
outer gull-wing leads contacting the intermediate pads, wherein:
each of the outer gull-wing leads has a first portion directly contacting the corresponding intermediate pad, a second portion continuous with the first portion and extending away from the intermediate pad, and a third portion continuous with the second portion, opposite from the first portion;
the first portion extends laterally in a first direction from a boundary with the second portion, wherein the first direction is parallel to a surface of the encapsulation material containing the intermediate pads;
the third portion extends laterally in a second direction, opposite from the first direction, wherein the first direction is parallel to the surface of the encapsulation material containing the intermediate pads; and
the third portion is not coplanar with the first portion, being offset by the second portion, wherein each of the intermediate pads includes a plurality of ribbon stitch bond strips.

11. The microelectronic device of claim 10, wherein external attachment surfaces of the outer gull-wing leads are located outside of the external attachment surfaces of the inner gull-wing leads, wherein the external attachment surface of each outer gull-wing lead is located farther from a center of the first die than the external attachment surface of an inner gull-wing lead located adjacent to the outer gull-wing lead.

12. The microelectronic device of claim 10, wherein the inner gull-wing leads are located outside of the encapsulation material.

13. The microelectronic device of claim 10, wherein the outer gull-wing leads are located outside of the encapsulation material.

14. The microelectronic device of claim 10, wherein each of the intermediate pads includes plated metal, wherein the plated metal conforms to contours of electrically conductive elements of the intermediate pads contacting the plated metal.

15. The microelectronic device of claim 10, wherein each of the intermediate pads includes a preformed metal pad.

* * * * *